(12) United States Patent
Nishizaki et al.

(10) Patent No.: US 12,255,273 B2
(45) Date of Patent: Mar. 18, 2025

(54) DISPLAY DEVICE AND METHOD FOR FABRICATING THE SAME

(71) Applicant: SAMSUNG DISPLAY CO., LTD., Yongin-si (KR)

(72) Inventors: Shogo Nishizaki, Seoul (KR); Jaehyun Kim, Suwon-si (KR); Seokhoon Seo, Seoul (KR); Soyoung Lee, Suwon-si (KR); Seungjae Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 144 days.

(21) Appl. No.: 16/781,398

(22) Filed: Feb. 4, 2020

(65) Prior Publication Data

US 2020/0266323 A1    Aug. 20, 2020

(30) Foreign Application Priority Data

Feb. 15, 2019   (KR) .................. 10-2019-0017682
Jun. 13, 2019   (KR) .................. 10-2019-0069840

(51) Int. Cl.
*H01L 33/56*      (2010.01)
*H01L 27/15*      (2006.01)
(Continued)

(52) U.S. Cl.
CPC ............ *H01L 33/56* (2013.01); *H01L 27/156* (2013.01); *H01L 33/0095* (2013.01);
(Continued)

(58) Field of Classification Search
CPC ..... H01L 2933/0033; H01L 2933/0058; H01L 51/5256; H01L 33/56; H01L 27/156;
(Continued)

(56) References Cited

U.S. PATENT DOCUMENTS 6,919,282 B2 *   7/2005  Sakama  ............... G02B 27/017
                                                    438/769
9,252,393 B2     2/2016  Kim
(Continued)

FOREIGN PATENT DOCUMENTS

CN      102084716 A    6/2011
CN      107689387 A    2/2018
(Continued)

OTHER PUBLICATIONS

Office action dated on Mar. 27, 2024 issued in corresponding Korean Patent Application No. 10-2019-0069840.
(Continued)

*Primary Examiner* — Ratisha Mehta
(74) *Attorney, Agent, or Firm* — F. CHAU & ASSOCIATES, LLC

(57) ABSTRACT

A display device includes a substrate and a light emitting layer on the substrate. The display device further includes a sealing portion on the light emitting layer. The sealing portion comprises a first inorganic layer. The first inorganic layer comprises at least one layer including silicon, oxygen, nitrogen and hydrogen. The at least one layer of the first inorganic layer includes a content of silicon of about 30-40 (at %), a content of oxygen of about 15-35 at %, a content of nitrogen of about 10-20 at %, a content of hydrogen of about 20-30 at %.

29 Claims, 19 Drawing Sheets

(51) Int. Cl.
  *H01L 33/00* (2010.01)
  *H01L 33/58* (2010.01)
  *H10K 50/844* (2023.01)
  *H10K 50/858* (2023.01)
  *H10K 59/12* (2023.01)
  *H10K 71/00* (2023.01)

(52) U.S. Cl.
  CPC ............ *H01L 33/58* (2013.01); *H10K 50/844* (2023.02); *H10K 50/858* (2023.02); *H10K 59/12* (2023.02); *H10K 71/00* (2023.02); *H01L 2933/0033* (2013.01); *H01L 2933/0058* (2013.01)

(58) Field of Classification Search
  CPC ............ H01L 33/0095; H01L 33/58; H10K 50/844; H10K 50/858; H10K 59/12; H10K 71/00
  See application file for complete search history.

(56) References Cited

U.S. PATENT DOCUMENTS

| | | | |
|---|---|---|---|
| 2003/0203210 A1 | 10/2003 | Graff et al. | |
| 2005/0249876 A1* | 11/2005 | Kawahara | C23C 16/45561 156/345.33 |
| 2006/0078677 A1* | 4/2006 | Won | C23C 28/42 427/248.1 |
| 2007/0278489 A1* | 12/2007 | Yamazaki | H01L 27/3244 257/59 |
| 2008/0096305 A1* | 4/2008 | Takai | H01L 31/076 438/96 |
| 2008/0132080 A1* | 6/2008 | Anwar | C23C 16/345 438/758 |
| 2009/0061603 A1* | 3/2009 | Shimoto | B23K 26/0676 438/487 |
| 2009/0078974 A1* | 3/2009 | Nagai | H01L 27/14625 257/E31.127 |
| 2009/0283775 A1* | 11/2009 | Yamazaki | H01L 27/12 257/E33.053 |
| 2009/0302408 A1* | 12/2009 | Nakagawa | H01L 27/14623 257/E31.127 |
| 2011/0100458 A1 | 5/2011 | Kang et al. | |
| 2011/0186822 A1* | 8/2011 | Adachi | H01L 51/524 257/40 |
| 2013/0059155 A1 | 3/2013 | Choi et al. | |
| 2014/0264311 A1* | 9/2014 | Lang | H01L 51/5268 257/40 |
| 2017/0005292 A1* | 1/2017 | Lee | H01L 51/5256 |
| 2017/0107345 A1* | 4/2017 | Kon | C09D 183/04 |
| 2017/0221976 A1* | 8/2017 | Park | H10K 50/844 |
| 2018/0040847 A1* | 2/2018 | Lee | H10K 59/879 |
| 2018/0047800 A1 | 2/2018 | Choi et al. | |
| 2018/0122884 A1 | 5/2018 | Yamazaki et al. | |
| 2018/0331328 A1* | 11/2018 | Won | H01L 51/5203 |
| 2019/0019992 A1 | 1/2019 | Kim et al. | |
| 2019/0181373 A1* | 6/2019 | Kim | H10K 50/822 |

FOREIGN PATENT DOCUMENTS

| | | |
|---|---|---|
| JP | 2007-280901 | 10/2007 |
| JP | 2007-294416 A2 | 11/2007 |
| KR | 10-2015-0056376 | 5/2015 |
| KR | 10-2018-0003287 | 1/2018 |
| KR | 10-2018-0016694 A | 2/2018 |
| KR | 10-2018-0018969 | 2/2018 |
| KR | 10-2018-0112925 | 10/2018 |

OTHER PUBLICATIONS

Office Action dated Apr. 1, 2024 issued in corresponding Chinese Patent Application No. 202010093015.2.
Office action dated on Sep. 20, 2024 issued in counterpart Chinese Patent Application No. 202010093015.2.

* cited by examiner

DISPLAY DEVICE AND METHOD FOR FABRICATING THE SAME

CROSS-REFERENCE TO RELATED APPLICATION

This application claims priority under 35 U.S.C. § 119 to Korean Patent Application No. 10-2019-0017682, filed on Feb. 15, 2019 in the Korean Intellectual Property Office (KIPO) and Korean Patent Application No. 10-2019-0069840, filed on Jun. 13, 2019 in KIPO, the disclosures of which are incorporated by reference in their entirety herein.

TECHNICAL FIELD

Exemplary embodiments of the present invention relate to a display device, and more particularly, to a display device that minimizes a deviation in light transmittance variation due to the wavelength of the sunlight in a sealing portion and to a method of manufacturing the display device.

DISCUSSION OF RELATED ART

Flat panel display ("FPD") devices have advantages of reduced weight and volume as compared to cathode ray tubes ("CRT"). Examples of such FPD devices may include liquid crystal display ("LCD") devices, field emission display ("FED") devices, plasma display panel ("PDP") devices and organic light emitting diode ("OLED") display devices.

Among such display devices, the OLED display device displays images using an OLED that generates light by the recombination of electrons and holes.

The OLED display device may be used as a display in a vehicle. However, OLED displays in vehicles are often exposed to sunlight for a long time. Therefore, a deviation in light transmittance variation due to the wavelength of sunlight increases in a sealing portion. The deviation in light transmittance results in color inequality in the display device. Accordingly, the image quality of the display device may be degraded.

SUMMARY

Exemplary embodiments may be directed to a display device capable of substantially minimizing a deviation in light transmittance variation according to wavelength of sunlight in a sealing portion and to a method of manufacturing the display device.

According to an exemplary embodiment, a display device includes a substrate and a light emitting layer on the substrate. The display device further includes a sealing portion on the light emitting layer. The sealing portion comprises a first inorganic layer. The first inorganic layer comprises at least one layer including silicon, oxygen, nitrogen and hydrogen. The at least one layer of the first inorganic layer includes a content of silicon of about 30-40 (at %), a content of oxygen of about 15-35 at %, a content of nitrogen of about 10-20 at %, a content of hydrogen of about 20-30 at %.

The silicon content may be about 35 at %, the oxygen content may be about 25 at %, the nitrogen content may be about 15 at %, and the hydrogen content may be about 25 at %.

The first inorganic layer may include SiON:H.

The sealing portion may further include a second inorganic layer, and the second inorganic layer may be disposed between the first inorganic layer and the light emitting layer.

The sealing portion may further include at least one organic layer.

The at least one organic layer may be disposed between the first inorganic layer and the second inorganic layer.

The first inorganic layer may have a refractive index substantially equal to or lower than about 1.70.

The first inorganic layer may include at least two sub-inorganic layers.

The at least two sub-inorganic layers may include a first sub-inorganic layer on the light emitting layer, and may further include at least one of a second sub-inorganic layer on the first sub-inorganic layer, and a third sub-inorganic layer below the first sub-inorganic layer.

Contents of silicon, oxygen, nitrogen, and hydrogen included in the first sub-inorganic layer may be about 30-40 at %, about 15-35 at %, about 10-20 at %, and about 20-30 at %, respectively.

At least one of the second sub-inorganic layer and the third sub-inorganic layer may include silicon, nitrogen, and hydrogen, and contents of the silicon, the nitrogen, and the hydrogen included in at least one of the second sub-inorganic layer and the third sub-inorganic layer may be about 30-50 at %, about 30-50 at %, and about 20-30 at %, respectively.

The contents of the silicon, the nitrogen, and the hydrogen included in at least one of the second sub-inorganic layer and the third sub-inorganic layer may be about 40 at %, about 40 at % and about 20 at %, respectively.

The contents of the silicon, the nitrogen, and the hydrogen included in at least one of the second sub-inorganic layer and the third sub-inorganic layer may be about 30 at %, about 50 at % and about 20 at %, respectively.

The first sub-inorganic layer may include SiON:H, and at least one of the second sub-inorganic layer and the third sub-inorganic layer may include SiNx:H.

The first sub-inorganic layer, the second sub-inorganic layer, and the third sub-inorganic layer may have different refractive indices from each other.

The first sub-inorganic layer may have a refractive index in a range from about 1.47 to about 1.70, and the second sub-inorganic layer and the third sub-inorganic layer may have a refractive index higher than that of the first sub-inorganic layer.

According to another exemplary embodiment, a display device includes a substrate and a light emitting layer on the substrate. A sealing portion is on the light emitting layer. The sealing portion comprises a first inorganic layer. The first inorganic layer comprises a plurality of sub-inorganic layers disposed adjacent to each other. One of the plurality of sub-inorganic layers includes a content of silicon of about 30-40 at %, a content of oxygen of about 15-35 at %, a content of nitrogen of about 10-20% and a content of hydrogen of about 20-30 at %.

According to another exemplary embodiment, a method of manufacturing a display device includes forming a light emitting layer on a substrate. A structure comprising the substrate and the light emitting layer is disposed in a chamber. The following is supplied into the chamber; $SiH_4$ from a first supply pipe, $NH_3$ from a second supply pipe, $N_2O$ from a third supply pipe, $N_2$ from a fourth supply pipe, and $H_2$ from a fifth supply pipe to form an inorganic layer of a sealing portion on the light emitting layer. A flow rate of the $N_2O$ into the chamber is about 5 times or more a flow rate of the $NH_3$ into the chamber.

A flow rate of the $N_2O$ may be in a range from about 1330 standard cubic centimeter per minute (sccm) to about 3990 sccm, and a flow rate of the $NH_3$ may be in a range from about 250 sccm to about 750 sccm.

A flow rate of the $SiH_4$ may be in a range from about 495 sccm to about 1485 sccm.

A flow rate of the $N_2$ may be in a range from about 4930 sccm to about 14790 sccm.

A flow rate of the $H_2$ may be in a range from about 5635 sccm to about 16905 sccm.

The $SiH_4$ from the first supply pipe, the $NH_3$ from the second supply pipe, the $N_2O$ from the third supply pipe, the $N_2$ from the fourth supply pipe, and the $H_2$ from the fifth supply pipe may be mixed at a mixing unit in the chamber, and injected toward the structure through an injecting unit in the chamber.

The inorganic layer may include silicon, oxygen, nitrogen, and hydrogen, and contents of the silicon, the oxygen, the nitrogen, and the hydrogen included in the inorganic layer may be about 30-40 at %, about 15-35 at %, about 10-20 at %, and about 20-30 at %, respectively.

The contents of the silicon, the oxygen, the nitrogen, and the hydrogen included in the inorganic layer may be about 35 at %, about 25 at %, about 15 at % and about 25 at %/o, respectively.

The inorganic layer may include SiON:H,

The inorganic layer may have a refractive index substantially equal to or lower than about 1.70.

The method may further include, before forming the inorganic layer: supplying, into the chamber, $SiH_4$ from the first supply pipe, $NH_3$ from the second supply pipe, $N_2$ from the fourth supply pipe, and $H_2$ from the fifth supply pipe so as to form a sub-inorganic layer of the sealing portion on the light emitting layer.

The method may further include: supplying, into the chamber, $SiH_4$ from the first supply pipe, $NH_3$ from the second supply pipe, $N_2$ from the fourth supply pipe, and $H_2$ from the fifth supply pipe so as to form a second sub-inorganic layer of the sealing portion on the inorganic layer.

In another exemplary embodiment, a display device includes a substrate and a light emitting layer on the substrate. A sealing portion is on the light emitting layer. The sealing portion comprises a first inorganic layer. The first inorganic layer comprises at least one layer including silicon, oxygen, nitrogen and hydrogen. A difference in a light transmittance of the at least one layer that has been irradiated with sunlight for 1-6 hours in a blue light wavelength region, a green light wavelength region and a red light wavelength region as compared to a light transmittance of the at least one layer that has not been irradiated with sunlight in the blue light wavelength region, the green light wavelength region and the red light wavelength region is less than or equal to about 0.4%.

The foregoing is illustrative only and is not intended to be in any way limiting. In addition to the illustrative aspects, embodiments and features described above, further aspects, embodiments and features will become apparent by reference to the drawings and the following detailed description.

BRIEF DESCRIPTION OF THE DRAWINGS

A more complete appreciation according to an embodiment will become more apparent by describing in detail embodiments thereof with reference to the accompanying drawings, wherein.

DETAILED DESCRIPTION OF THE EXEMPLARY EMBODIMENTS

Figure 1:
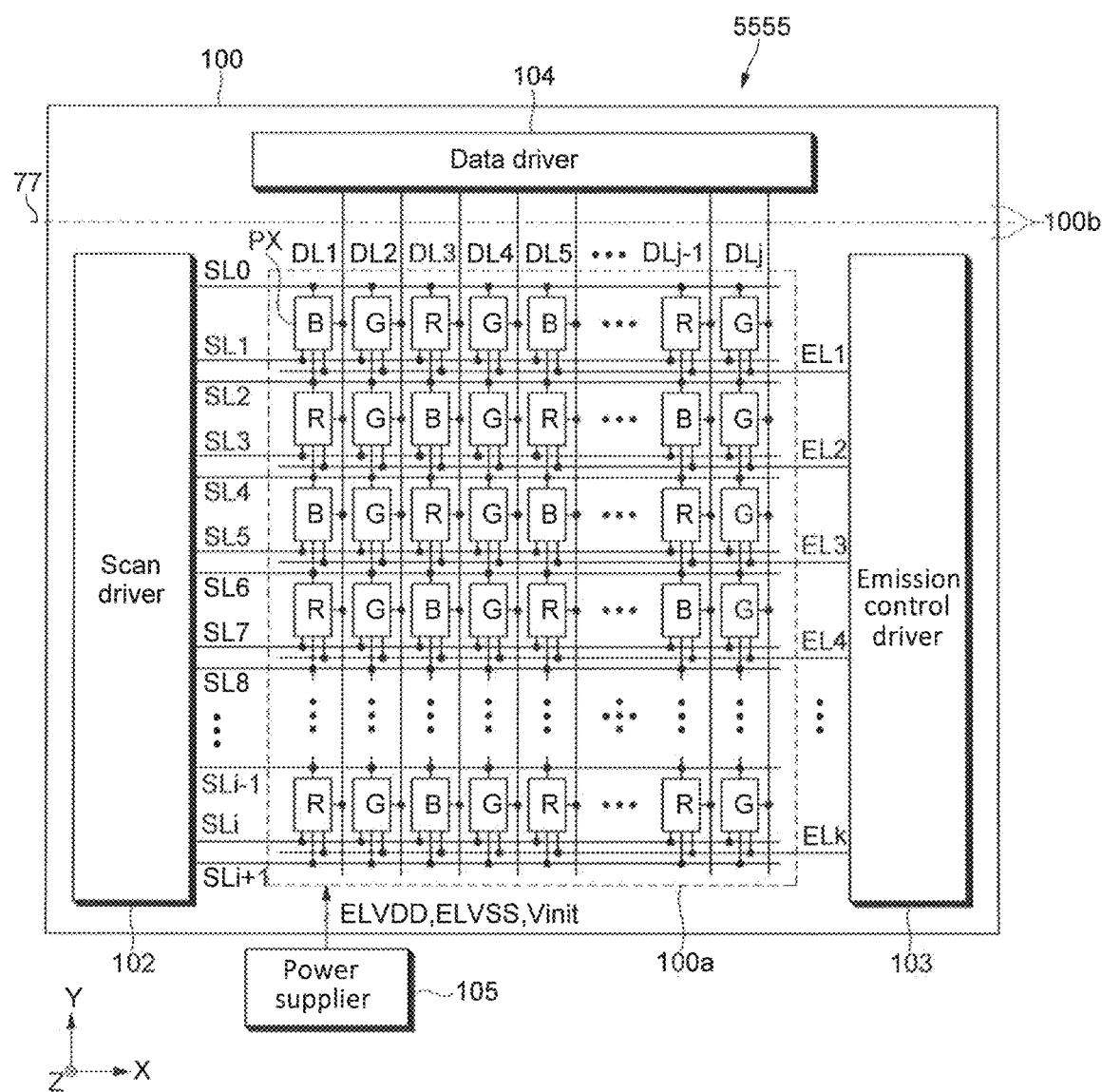
FIG. 1 is a block diagram illustrating a display device according to an embodiment.

Exemplary embodiments will now be described more fully hereinafter with reference to the accompanying drawings. Although the invention may be modified in various manners and have many embodiments, exemplary embodiments are illustrated in the accompanying drawings and will be mainly described in the specification. However, the scope of the present inventive concepts are not limited to the exemplary embodiments.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Accordingly, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within +30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Some of the parts which are not associated with the description may not be provided in order to specifically describe an exemplary embodiment and like reference numerals refer to like elements throughout the specification.

Hereinafter, a display device and a method of manufacturing the display device will be described in detail with reference to FIGS. 1 to 11C.

FIG. 1 is a block diagram illustrating a display device according to an exemplary embodiment.

A display device 5555 according to an exemplary embodiment of the present inventive concepts includes a substrate 100, a scan driver 102, an emission control driver 103, a data driver 104 and a power supplier 105, as illustrated in FIG. 1.

On the substrate 100, "i+2" number of scan lines SL0 to SLi+1, "k" number of emission control lines EL1 to ELk, "j" number of data lines DL1 to DLj and "k*j" number of pixels PX, the scan driver 102, the emission control driver 103 and the data driver 104 are disposed, where each of i, j and k is a natural number greater than 1.

The plurality of pixels PX are located in a display area 100a of the substrate 100.

The "i+2" number of scan lines SL0 to SLi+1, the "k" number of emission control lines EL1 to ELk, and the "j" number of data lines DL1 to DLj are located in the display area 100a of the substrate 100. In such an exemplary embodiment, the "i+2" number of scan lines SL0 to SLi+1 extend to a non-display area 100b to be connected to the scan driver 102, the "k" number of emission control lines EL1 to ELk extend to the non-display area 100b to be connected to the emission control driver 103, and the "j" number of data lines DL1 to DLj extend to the non-display area 100b to be connected to the data driver 104.

The scan driver 102 and the emission control driver 103 may be manufactured on the substrate 100 through a process substantially the same as a process in which the pixel PX is formed. For example, switching elements of the scan driver 102, switching elements of the emission control driver 103 and switching elements of the pixel PX may be formed on the substrate 100 through a photolithography process.

In an exemplary embodiment, the emission control driver 103 may be embedded in the scan driver 102. For example, the scan driver 102 may further perform the function of the emission control driver 103. In such an exemplary embodiment, the scan lines SL0 to SLi+1 and the emission control lines EL1 to ELk are driven together by the scan driver 102.

The data driver 104 may be manufactured in the form of a chip. The data driver 104 may be attached on the substrate 100 in a chip bonding manner. In an exemplary embodiment, the data driver 104 may be disposed on a separate printed circuit board instead of the substrate 100. In this embodiment, the data lines DL1 to DLj are connected to the data driver 104 through the printed circuit board.

In an exemplary embodiment, each of the scan driver 102 and the emission control driver 103 may be manufactured in the form of a chip. The chip-type scan driver 102 may be located at the non-display area 100b of the substrate 100 or on another separate printed circuit board. The chip-type emission control driver 103 may be located at the non-display area 100b of the substrate 100 or at another separate printed circuit board.

The scan lines SL0 to SLi+1 are arranged along a Y-axis direction, and each of the scan lines SL0 to SLi+1 extends along an X-axis direction. The emission control lines EL1 to ELk are arranged along the Y-axis direction, and each of the emission control lines EL1 to ELk extends along the X-axis direction. The data lines DL1 to DLj are arranged along the X-axis direction, and each of the data lines DL1 to DLj extends along the Y-axis direction. However, the arrangement of the scan lines and emission control lines are not limited to those shown in the exemplary embodiment of FIG. 1.

A scan line SL0 of the aforementioned scan lines SL0 to SLi+1 that is closest to the data driver 104 is defined as a first dummy scan line SL0, and a scan line SLi+1 of the aforementioned scan lines SL0 to SLi+1 that is farthest away from the data driver 104 is defined as a second dummy scan line SLi+1. In addition, the scan lines SL1 to SLi between the first dummy scan line SL0 and the second dummy scan line SLi+1 are respectively defined as first to i-th scan lines SL1 to SLi sequentially from a scan line that is close to the data driver 104.

The scan driver 102 generates scan signals according to a scan control signal provided from a timing controller. The scan driver 102 sequentially applies the scan signals to the plurality of scan lines SL0 to SLi+1. The scan driver 102 outputs first to i-th scan signals, a first dummy scan signal, and a second dummy scan signal. The first to i-th scan signals output from the scan driver 102 are applied to the first to i-th scan lines SL1 to SLi, respectively. For example, an n-th scan signal is applied to an n-th scan line SLn, where n is a natural number greater than or equal to 1 and less than or equal to i. In addition, the first dummy scan signal output from the scan driver 102 is applied to the first dummy scan line SL0. The second dummy scan signal output from the scan driver 102 is applied to the second dummy scan line SLi+1. However, exemplary embodiments of the present inventive concepts are not limited thereto.

During one frame period, the scan driver 102 outputs the first to i-th scan signals sequentially from the first scan signal. In such an exemplary embodiment, the scan driver 102 outputs the first dummy scan signal prior to the first scan signal, and outputs the second dummy scan signal subsequent to the i-th scan signal. In other words, the scan driver 102 outputs the first dummy scan signal first during the one frame period, and the second dummy scan signal is the last signal output during the one frame period. Accordingly, during the one frame period, the entire scan lines SL0 to SLi+1 including the dummy scan lines SL0 and SLi+1 are driven sequentially from the first dummy scan line SL0.

The emission control driver 103 generates emission control signals according to a control signal provided from a timing controller. The emission control driver 103 sequentially applies the emission control signals to the plurality of emission control lines EL1 to ELk. First to m-th emission control signals output from the emission control driver 103 are applied to first to m-th emission control lines EL1 to ELm, respectively. For example, an m-th emission control signal is applied to an m-th emission control line ELm, where m is a natural number greater than or equal to 1 and less than or equal to k. During one frame period, the emission control driver 103 outputs the first to k-th emission control signals sequentially from the first emission control signal. Accordingly, during the one frame period, the entire emission control lines EL1 to ELk are driven sequentially from the first emission control line EL1.

The data driver 104 applies first to j-th data voltages to the first to j-th data lines DL1 to DLj, respectively. For example, the data driver 104 receives image data signals and a data control signal from a timing controller. In addition, the data driver 104 samples the image data signals according to the data control signal, sequentially latch the sampled image data signals corresponding to one horizontal line in each horizontal period, and apply the latched image data signals to the data lines DL1 to DLj substantially simultaneously.

The pixels PX may be arranged on the substrate 100 in the display area 100a in the form of a matrix. The pixels PX emit lights having different colors from each other. For example, in the pixels PX illustrated in FIG. 1, a pixel indicated by a reference character "R" is a red pixel which emits a red light, a pixel indicated by a reference character "G" is a green pixel which emits a green light, and a pixel indicated by a reference character "B" is a blue pixel which emits a blue light. However, in other embodiments, the color of the pixels and their arrangement may vary from those in the exemplary embodiment shown in FIG. 1.

For example, the display device according to an embodiment may further include at least one white pixel which emits a white light. The white pixel may be disposed on the substrate 100 at the display area 100a.

One pixel is connected to at least one scan line. In an exemplary, as illustrated in FIG. 1, between a plurality of pixels PX connected to the first data line DL1, a blue pixel that is closest to the data driver 104 is connected to three scan lines that receive scan signals having different output timings, e.g., the first dummy scan line SL0, the first scan line SL1 and the second scan line SL2. In such an embodiment, between a plurality of pixels PX connected to the second data line DL2, a green pixel which is third farthest from the data driver 104 is connected to three scan lines that receive scan signals having different output timings, e.g., the fourth scan line SL4, the fifth scan line SL5 and the sixth scan line SL6.

In an exemplary embodiment, pixels that are connected in common to a same data line and located adjacent to each other are connected in common to at least one scan line. In other words, two adjacent pixels (e.g., in the Y-axis direction) connected to a same data line share at least one scan line. In one exemplary embodiment, a green pixel (hereinafter, "a first green pixel") that is connected to the second data line DL2 and is closest to the data driver 104 and a green pixel (hereinafter, "a second green pixel") that is connected to the second data line DL2 and is second closest from the data driver 104 are located adjacent to each other in the Y-axis direction, and the first green pixel and the second green pixel are connected in common to the second scan line SL2. In another exemplary embodiment, a green pixel that is connected to the second data line DL2 and is third closest from the data driver 104 is defined as a third green pixel. The third green pixel and the second green pixel are connected in common to the fourth scan line SL4.

Pixels connected in common to a same data line are independently connected to one or more different scan lines. In one exemplary embodiment, the first green pixel described above is connected independently to the first scan line SL, the second green pixel described above is connected independently to the third scan line SL3, and the third green pixel described above is connected independently to the fifth scan line SL5.

As such, each of pixels connected to a same data line is independently connected to at least one scan line. As used herein, the meaning of at least two pixels (e.g., the first pixel PX1 and the second pixel PX2) being connected to different scan lines is that at least one of scan lines connected to the first pixel PX is different from at least one of scan lines connected to the second pixel PX2. Accordingly, each of pixels connected to a same data line is connected to different scan lines.

On the other hand, as used herein, the meaning of at least two pixels (e.g., the first pixel PX1 and the second pixel PX2) being connected to a same scan line is that scan lines connected to the first pixel PX1 are completely the same as scan lines connected to the second pixel PX2. Accordingly, each of pixels connected to a same emission control line is connected to same scan lines. In one embodiment, pixels connected in common to the second emission control line EL2 are connected in common to the second scan line SL2, the third scan line SL3 and the fourth scan line SL4, for example.

For example, the red pixel and the blue pixel are connected to a (2p−1)-th data line and the green pixel is connected to a 2p-th data line, where p is a natural number. In one embodiment, for example, the red pixel and the blue pixel are connected to the first data line DL1, and the green pixel is connected to the second data line DL2.

One pixel (hereinafter, "a first predetermined pixel") connected to a (2p−1)-th data line (e.g., the first data line DL1) and one pixel (hereinafter, "a second predetermined pixel") connected to another (2p−1)-th data line (e.g., the third data line DL3) may be connected to a same scan line. In this embodiment, the first predetermined pixel emits a light having a color different from a color of a light emitted from the second predetermined pixel. In the exemplary embodiment shown in FIG. 1, the first predetermined pixel may be a blue pixel connected to the first dummy scan line SL0, the first scan line SL1, the second scan line SL2, and the first data line DL1, and the second predetermined pixel may be a red pixel connected to the first dummy scan line SL0, the first scan line SL1, the second scan line SL2, and the third data line DL3.

Two adjacent pixels (e.g., in the Y-axis direction) that are connected to a same data line (e.g., the (2p−1)-th data line)

and emit lights having different colors from each other, and at least one green pixel adjacent to one of the two adjacent pixels are included in a unit pixel for displaying a unit image. For example, in one exemplary embodiment, a red pixel connected to the third data line DL3 and the first scan line SL1, a blue pixel connected to the third data line DL3 and the third scan line SL3, a green pixel connected to the second data line DL2 and the first scan line SL1, and a green pixel connected to the fourth data line DL4 and the first scan line SL1 may collectively define a unit pixel.

Each pixel PX commonly receives a high potential driving voltage ELVDD, a low potential driving voltage ELVSS and an initializing voltage Vinit from the power supplier 105. In this embodiment, each pixel PX receives all of the high potential driving voltage ELVDD, the low potential driving voltage ELVSS and the initializing voltage Vinit.

Figure 2:
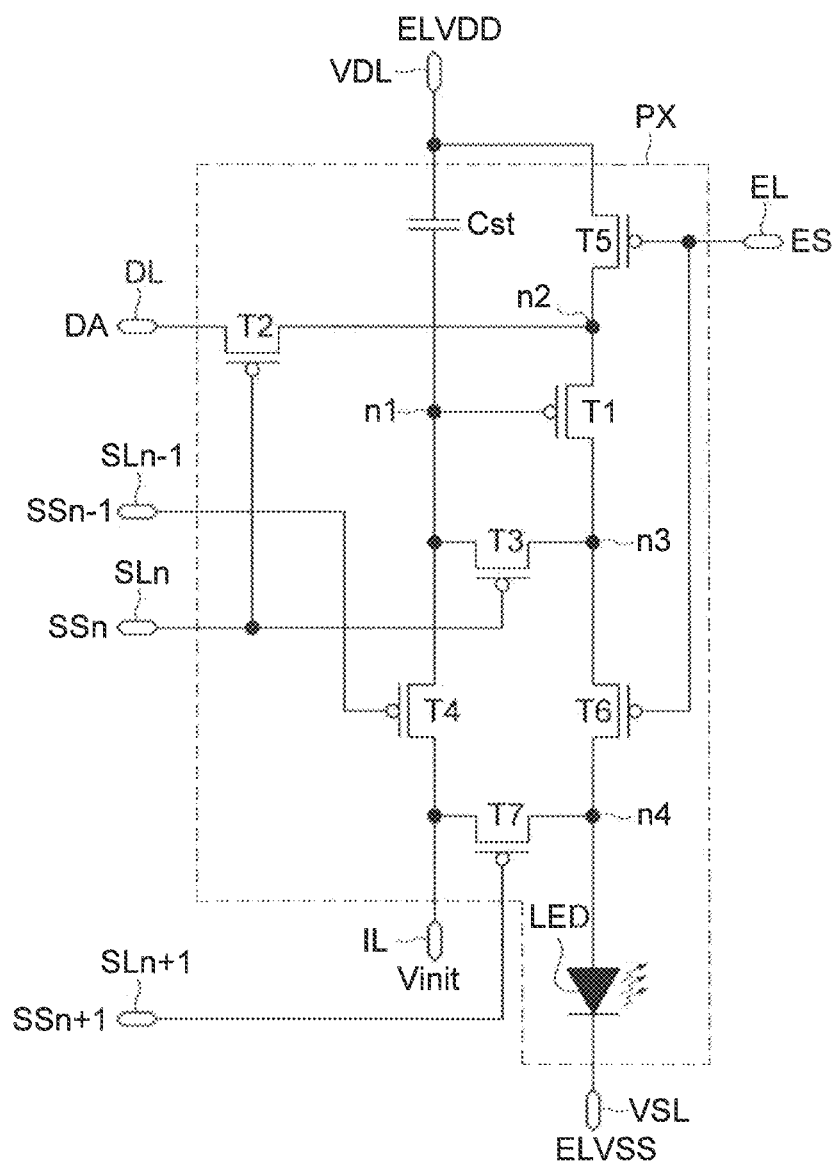
FIG. 2 is an equivalent circuit diagram illustrating one of pixels illustrated in FIG. 1.

FIG. 2 is an equivalent circuit diagram illustrating a pixel shown in FIG. 1.

In the exemplary embodiment shown in FIG. 2, a pixel PX may include a first switching element T1, a second switching element T2, a third switching element T3, a fourth switching element T4, a fifth switching element T5, a sixth switching element T6, a seventh switching element T7, a storage capacitor Cst and a light emitting element (hereinafter, referred to as a light emitting diode ("LED")). However, other exemplary embodiments may include a different amount of switches.

Each of the first, second, third, fourth, fifth, sixth and seventh switching elements T1, T2, T3, T4, T5, T6 and T7 may be a P-type transistor, as illustrated in FIG. 2. However, exemplary embodiments are not limited thereto, and each of the first, second, third, fourth, fifth, sixth and seventh switching elements T1, T2, T3, T4, T5, T6 and 17 may be an N-type transistor in other embodiments.

The first switching element T1 includes a gate electrode connected to a first node n1 and is connected between a second node n1 and a third node n3. One of a source electrode and a drain electrode of the first switching element T1 is connected to the second node n2, and the other of the source electrode and the drain electrode of the first switching element T1 is connected to the third node n3.

The second switching element T2 includes a gate electrode connected to the n-th scan line SLn and is connected between the data line DL and the second node n2. One of a source electrode and a drain electrode of the second switching element T2 is connected to the data line DL, and the other of the source electrode and the drain electrode of the second switching element T2 is connected to the second node n2. An n-th scan signal SSn is applied to the n-th scan line SLn.

The third switching element T3 includes a gate electrode connected to the n-th scan line SLn and is connected between the first node n1 and the third node n3. One of a source electrode and a drain electrode of the third switching element T3 is connected to the first node n1, and the other of the source electrode and the drain electrode of the third switching element T3 is connected to the third node n3.

The fourth switching element T4 includes a gate electrode connected to an (n−1)-th scan line SLn−1 and is connected between the first node n1 and an initialization line IL. One of a source electrode and a drain electrode of the fourth switching element T4 is connected to the first node n1, and the other of the source electrode and the drain electrode of the fourth switching element T4 is connected to the initialization line IL. The initializing voltage Vinit is applied to the initialization line IL, and an (n−1)-th scan signal SSn−1 is applied to the (n−1)-th scan line SLn−1.

The fifth switching element T5 includes a gate electrode connected to the emission control line EL, and is connected between the second node n2 and a high potential line VDL which is one of the power supply lines. One of a source electrode and a drain electrode of the fifth switching element T5 is connected to the high potential line VDL, and the other of the source electrode and the drain electrode of the fifth switching element T5 is connected to the second node n2. The high potential driving voltage ELVDD is applied to the high potential line VDL.

The sixth switching element T6 includes a gate electrode connected to the emission control line EL and is connected between the third node n3 and a fourth node n4. One of a source electrode and a drain electrode of the sixth switching element T6 is connected to the third node n3, and the other of the source electrode and the drain electrode of the sixth switching element T6 is connected to the fourth node n4. An emission control signal ES is applied to the emission control line EL.

The seventh switching element T7 includes a gate electrode connected to an (n+1)-th scan line SLn+1 and is connected between the initialization line IL and the fourth node n4. One of a source electrode and a drain electrode of the seventh switching element T7 is connected to the initialization line IL, and the other of the source electrode and the drain electrode of the seventh switching element T7 is connected to the fourth node n4. An (n+1)-th scan signal SSn+1 is applied to the (n+1)-th scan line SLn+1.

The storage capacitor Cst is connected between the high potential line VDL and the first node n1. The storage capacitor Cst stores a signal applied to the gate electrode of the first switching element T1 for one frame period.

The LED emits light corresponding to a driving current applied through the first switching element T1. The LED emits light with different brightnesses depending on the level of the driving current. An anode electrode of the LED is connected to the fourth node n4, and a cathode electrode of the LED is connected to a low potential line VSL which is another of the power supply lines. The low potential driving voltage ELVSS is applied to the low potential line VSL. The LED may be an organic light emitting diode ("OLED"). The anode electrode of the LED corresponds to a pixel electrode to be described below, and the cathode electrode of the LED corresponds to a common electrode to be described below.

The fourth switching element T4 is turned on when the (n−1)-th scan signal SSn−1 is applied to the (n−1)-th scan line SLn−1. The initializing voltage Vinit is applied to the first node n1 (i.e., the gate electrode of the first switching element T1) through the turned-on fourth switching element T14. Accordingly, the voltage of the gate electrode of the first switching element T1 is initialized by the initializing voltage Vinit.

The second switching element T2 and the third switching element T3 are turned on when the n-th scan signal SSn is applied to the n-th scan line SLn. A data voltage DA is applied to the first node n1 (e.g., the gate electrode of the first switching element T1) through the turned-on second switching element T2, and accordingly, the first switching element T1 is turned on. Accordingly, a threshold voltage of the first switching element T1 is detected, and the threshold voltage is stored in the storage capacitor Cst.

The fifth switching element T5 and the sixth switching element T6 are turned on when the emission control signal ES is applied to the emission control line EL. A driving current is applied to the LED through the turned-on fifth switching element T5, the turned-on first switching element T1, and the turned-on sixth switching element T6, such that the LED emits light.

The seventh switching element T7 is turned on when the (n+1)-th scan signal SSn+1 is applied to the (n+1)-th scan line SLn+1. The initializing voltage Vinit is applied to the fourth node n4 (e.g., the anode electrode of the LED) through the turned-on seventh switching element T7. Accordingly, the LED is biased in a reverse direction such that the LED is turned off.

Figure 3:
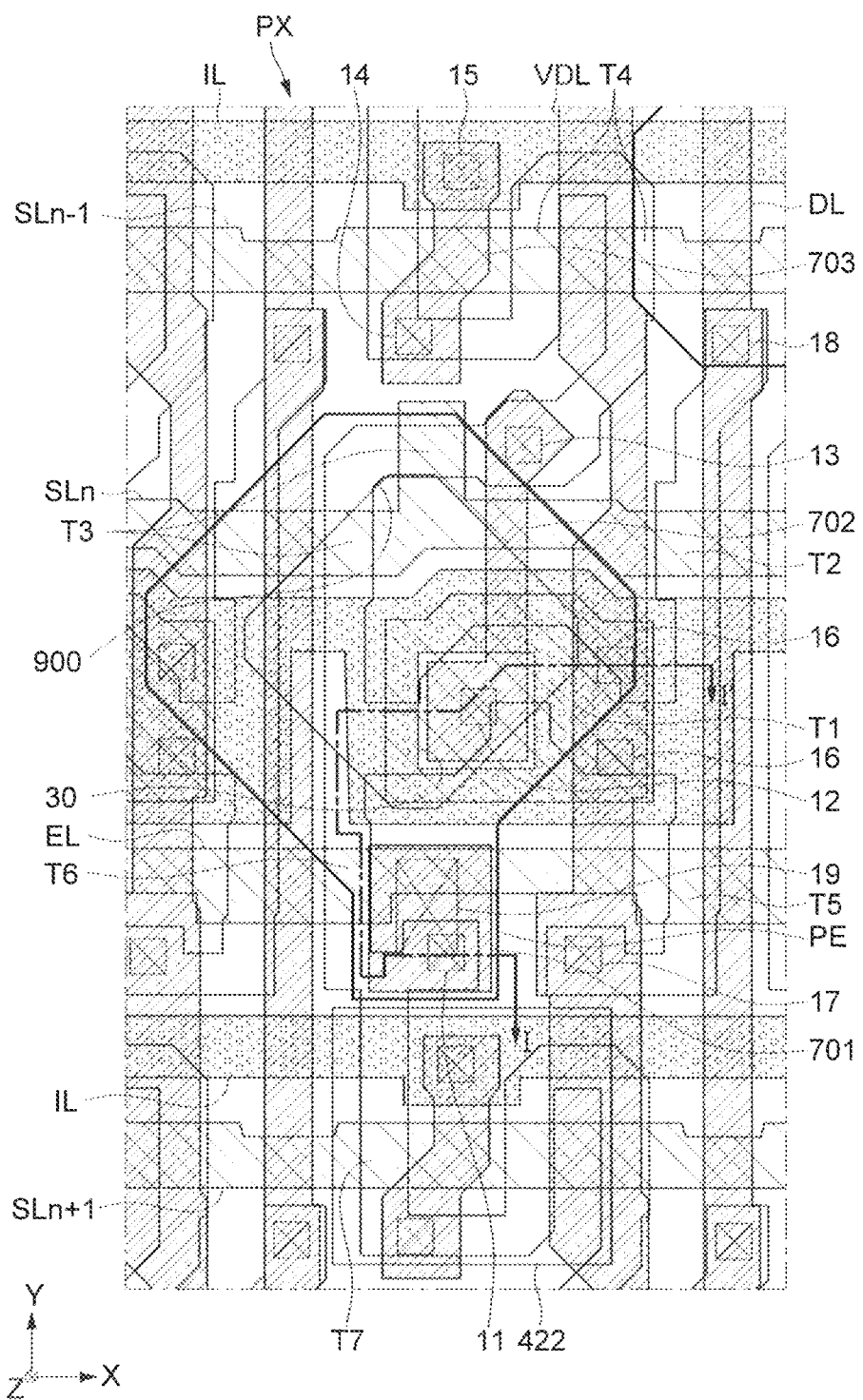
FIG. 3 is a plan view illustrating a display device including one of the pixels illustrated in FIG. 1 and lines connected thereto.

FIG. 3 is a plan view illustrating a display device including one of the pixels illustrated in FIG. 1 and lines connected thereto. FIGS. 4A to 4G are views illustrating a portion of the elements of FIG. 3. FIG. 5 is a cross-sectional view taken along line I-I' of FIG. 3.

Figure 4A:
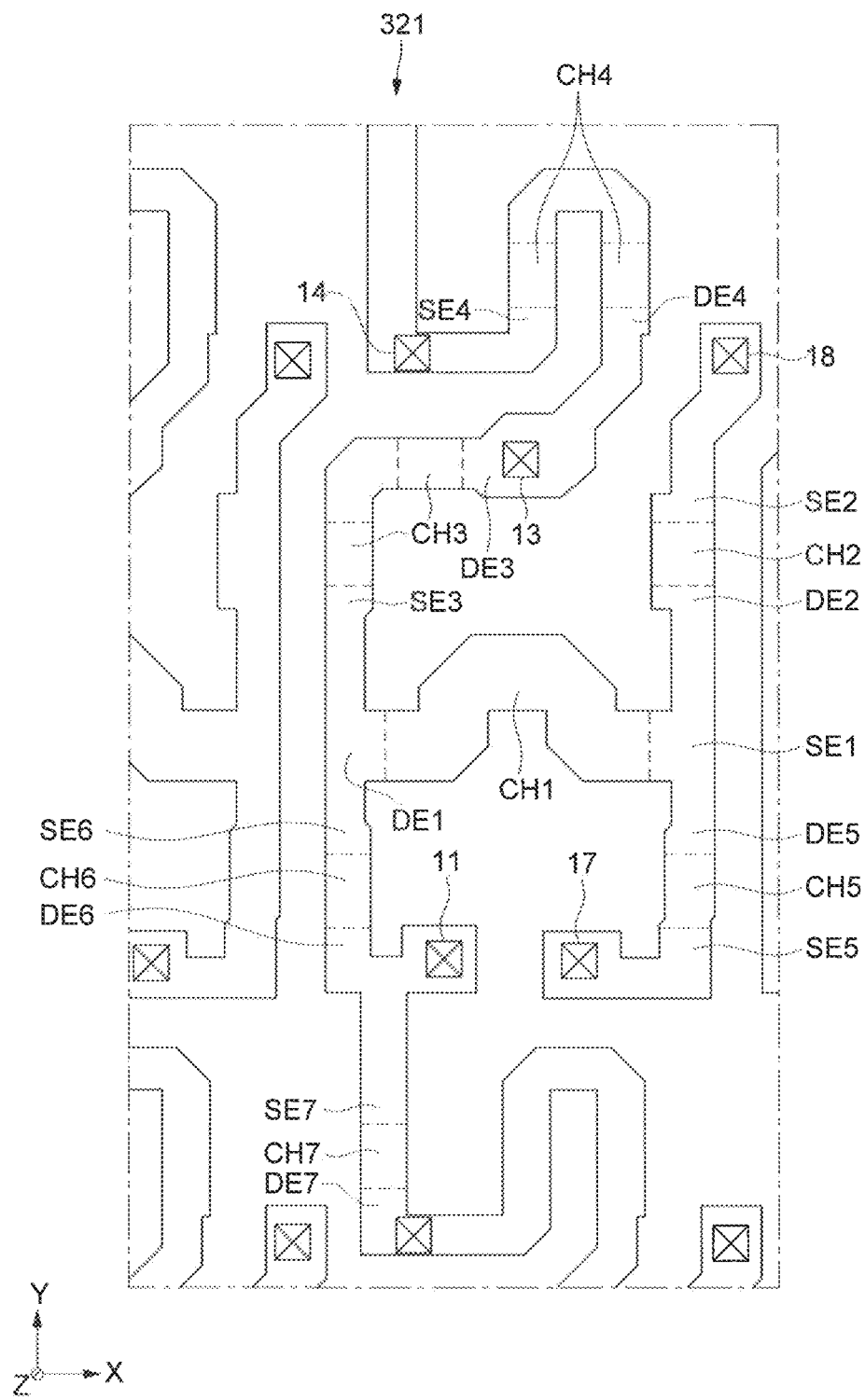
FIGS. 4A to 4G are views illustrating only a portion of the elements of FIG. 3.
Figure 4B:
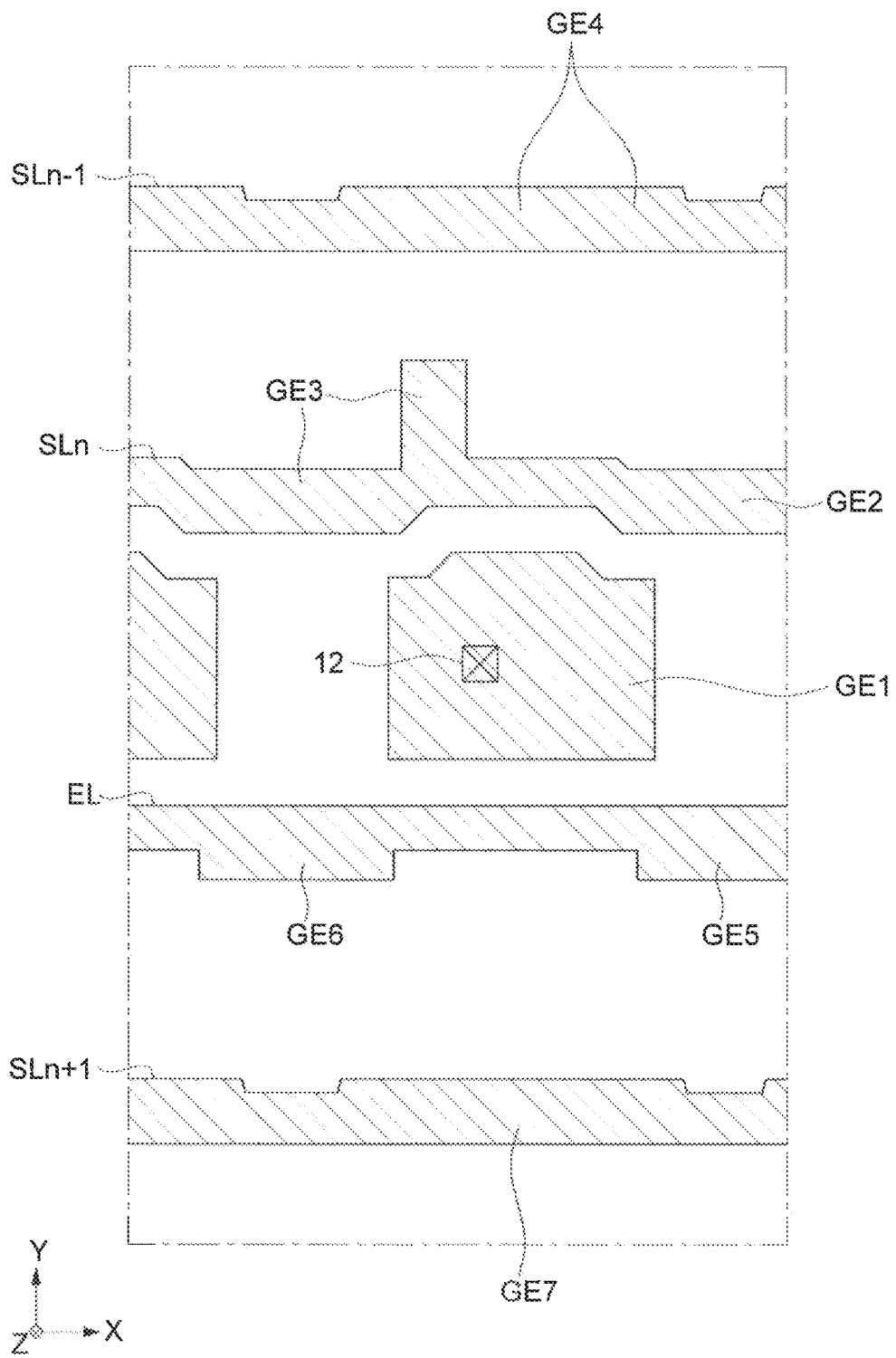
Figure 4C:
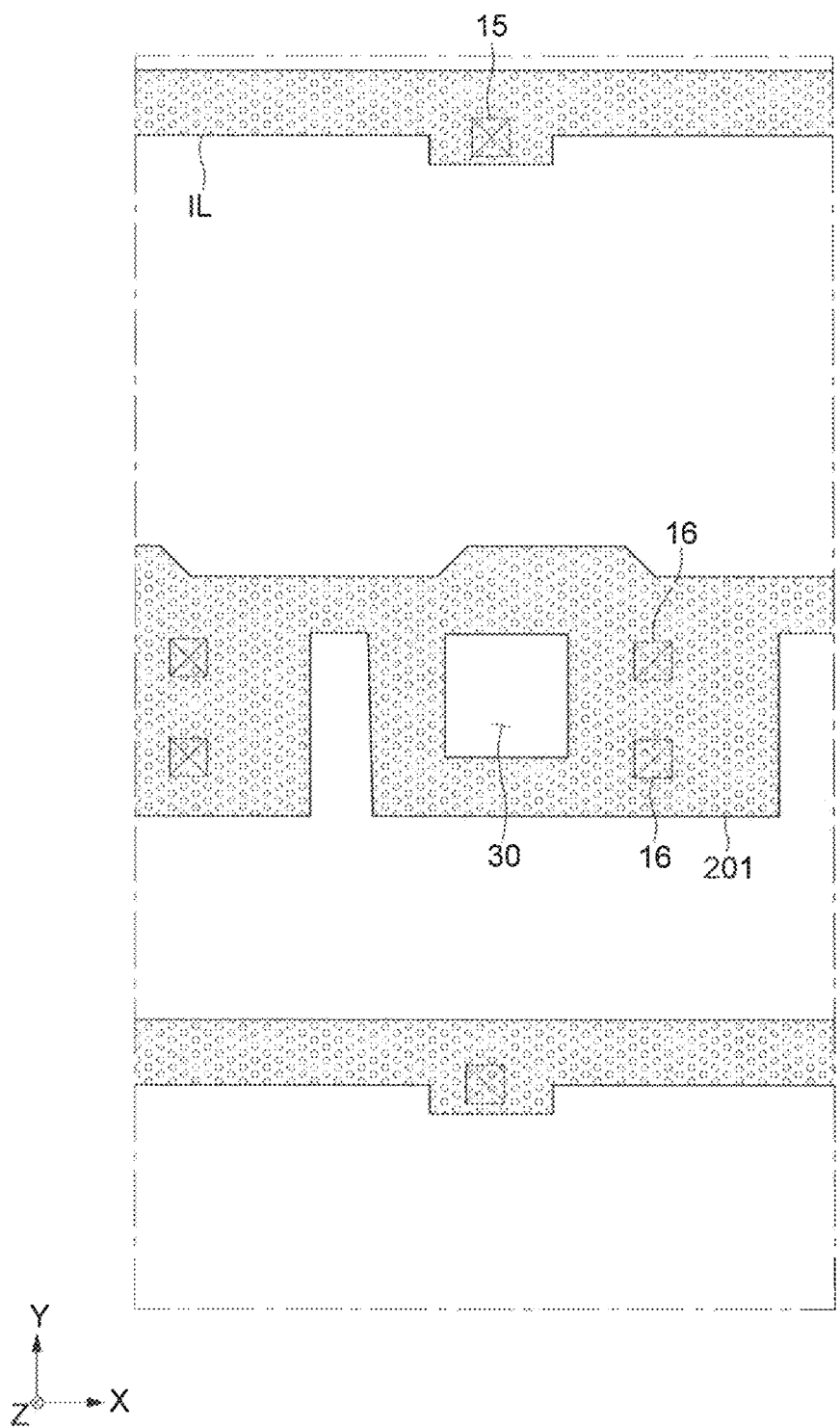
Figure 4D:
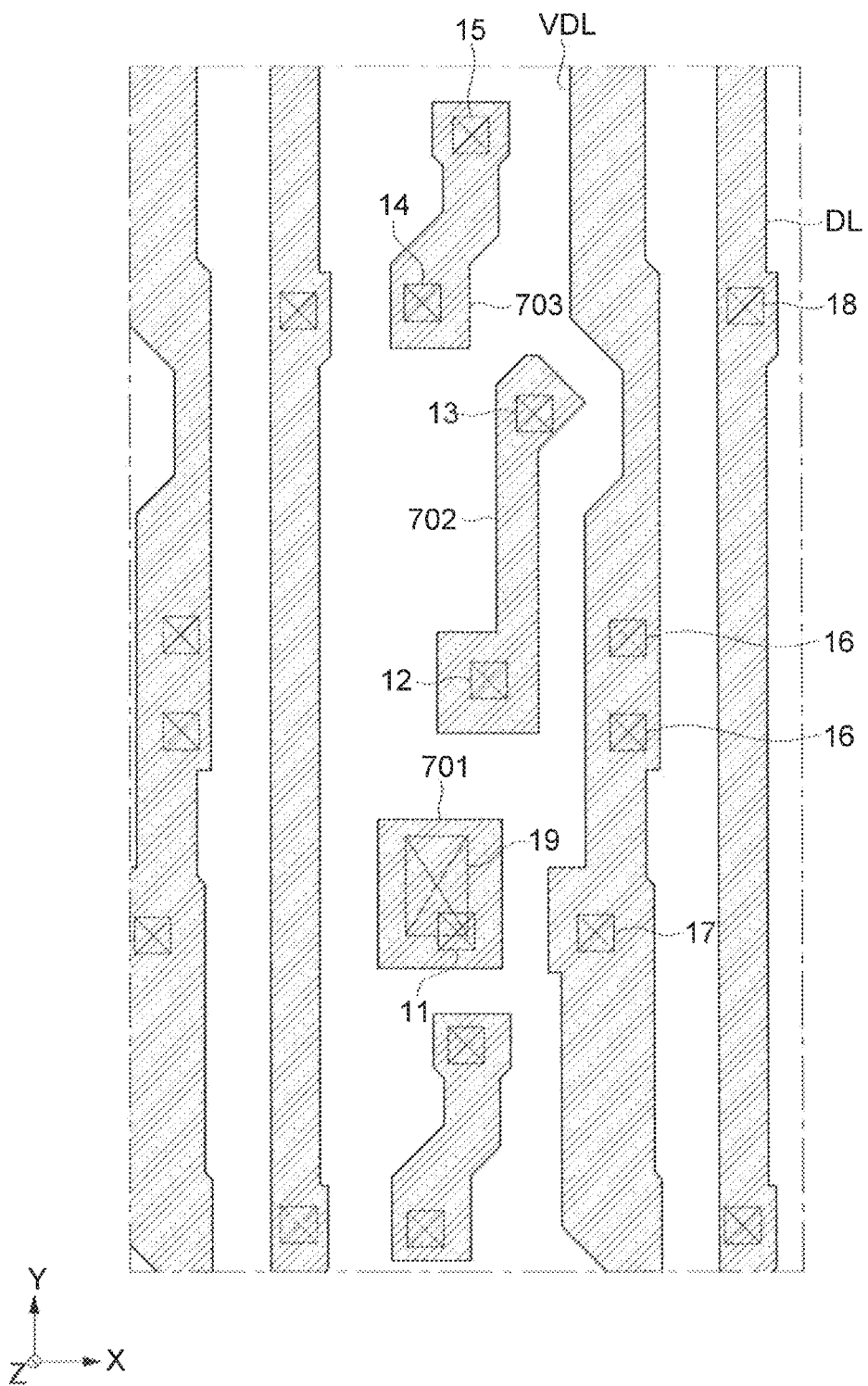
Figure 4E:
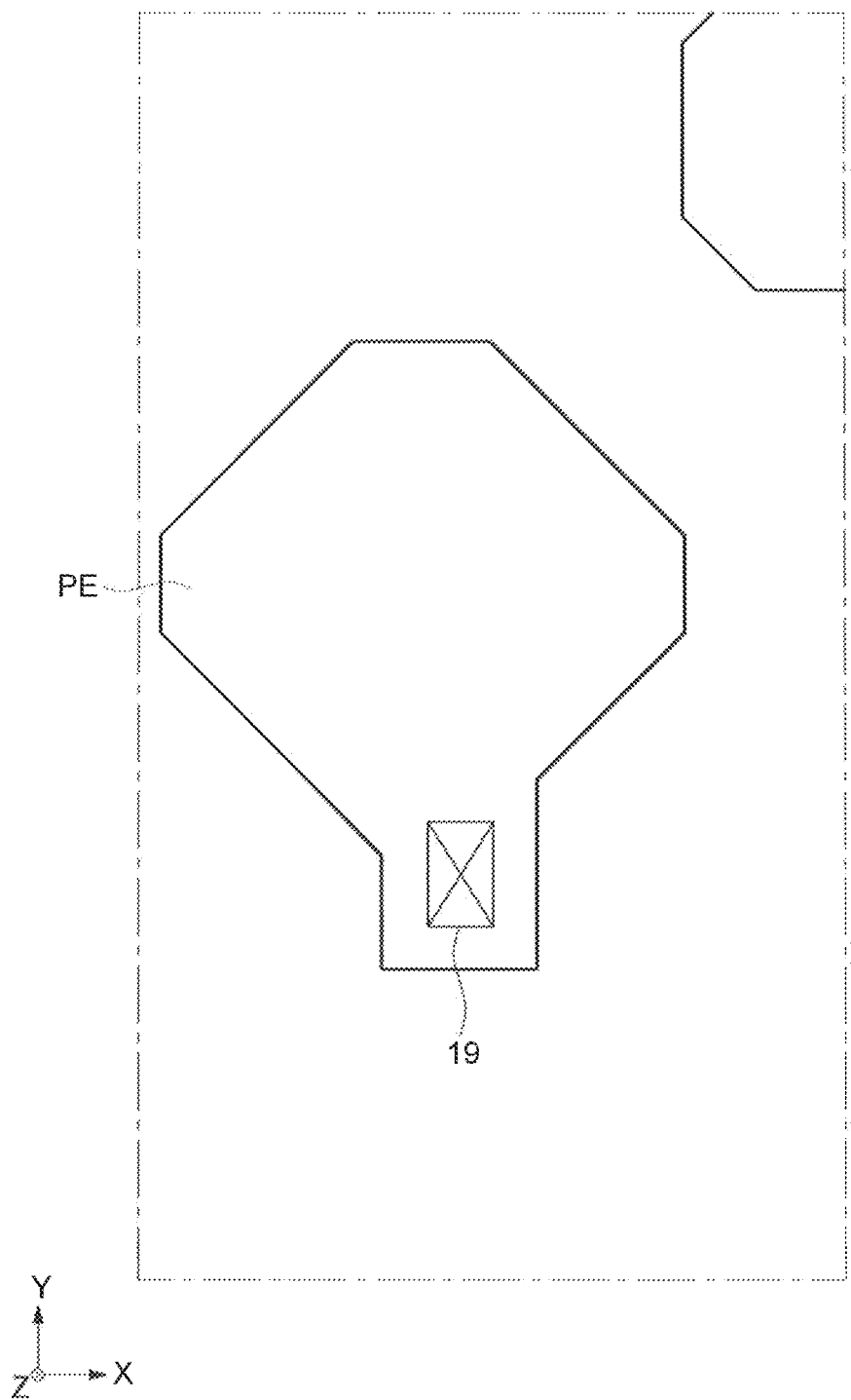
Figure 4F:
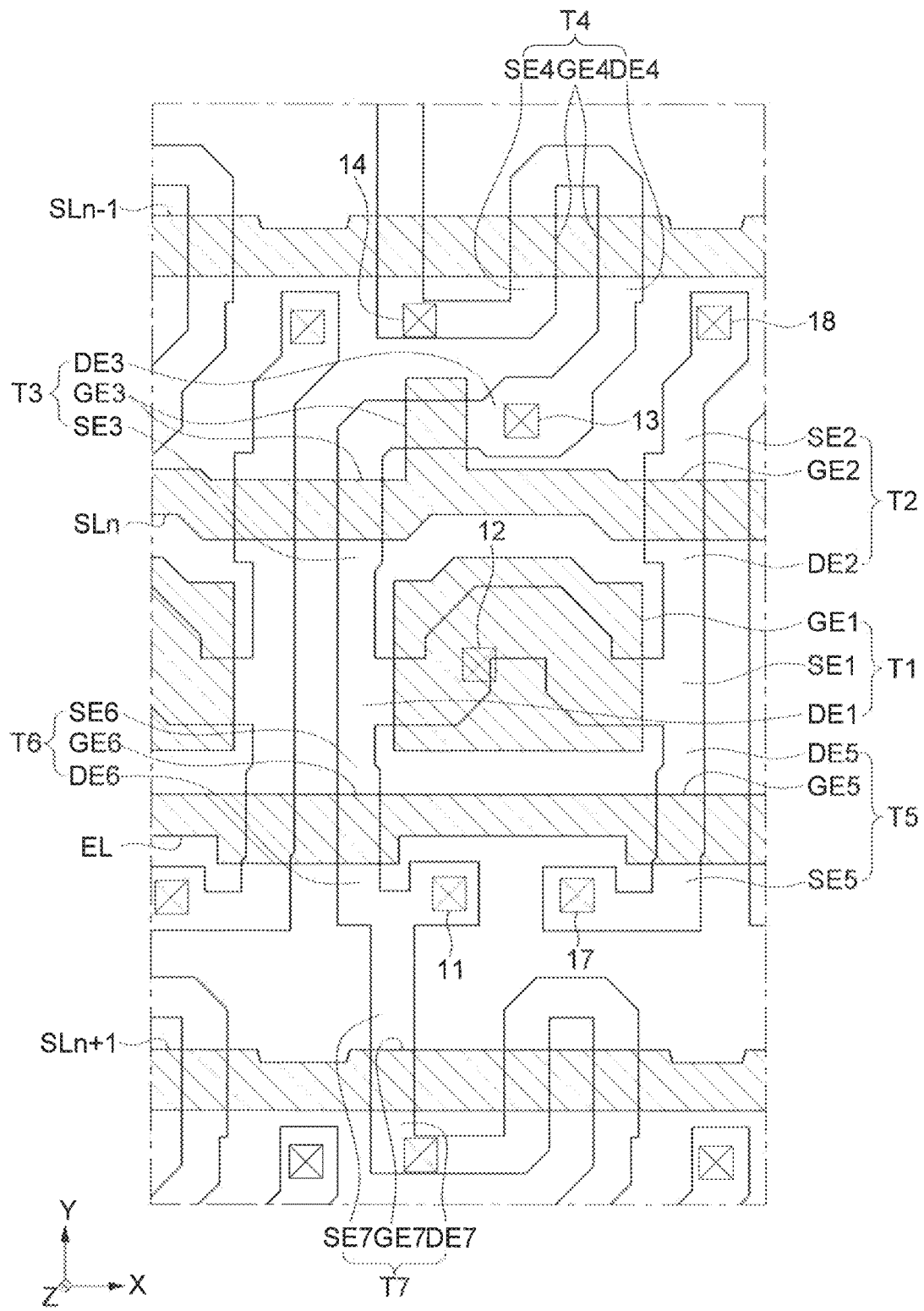
Figure 4G:
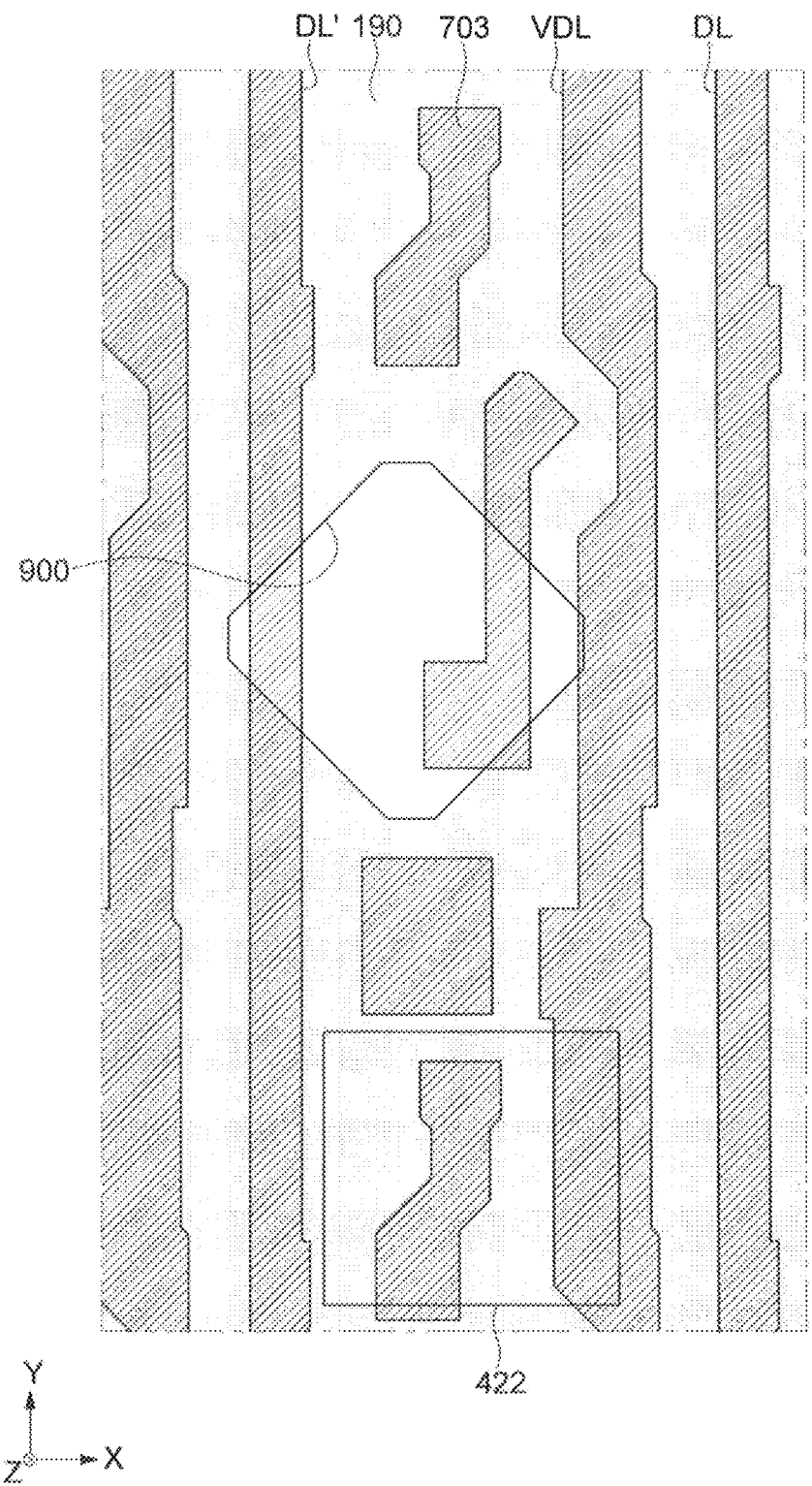
Figure 5:
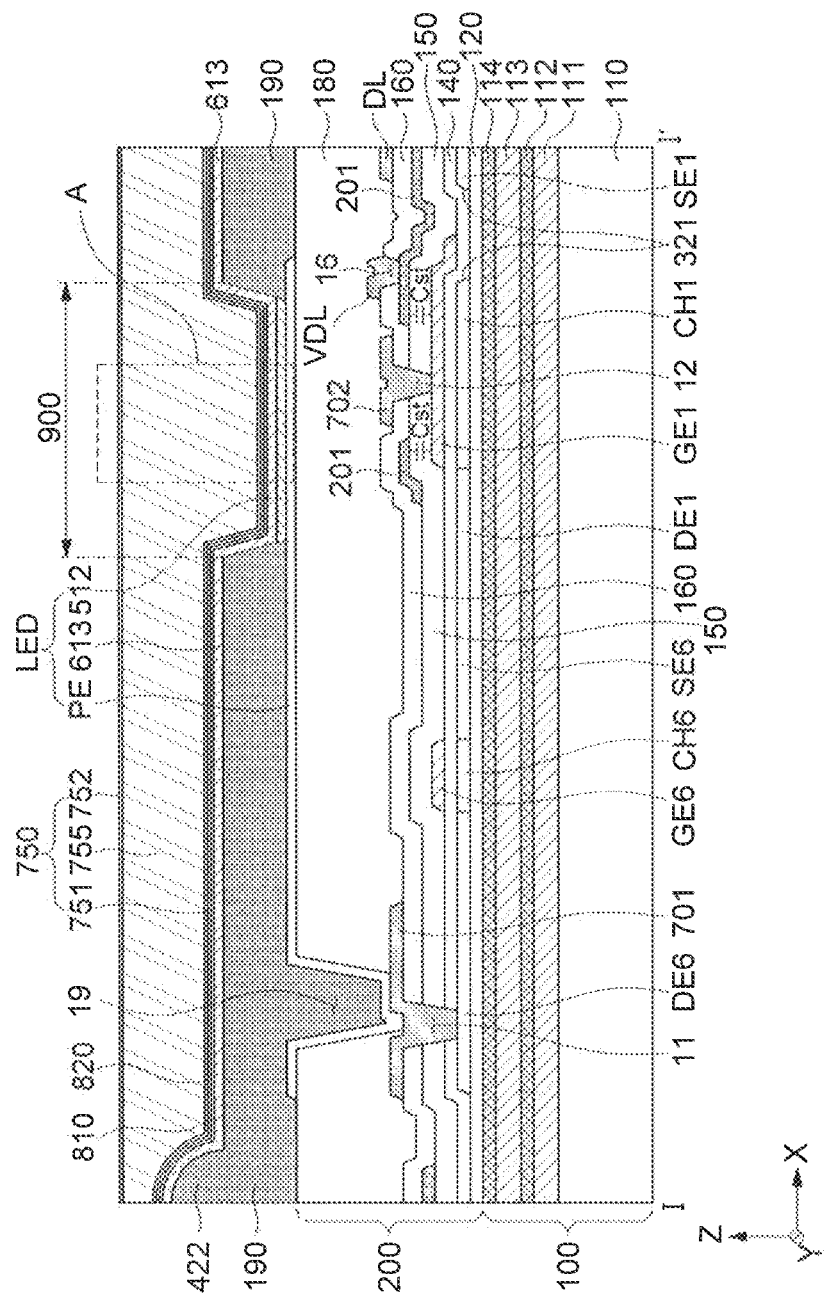
FIG. 5 is a cross-sectional view taken along line I-I' of FIG. 3.

FIG. 4A is a view illustrating a semiconductor layer 321 of FIG. 3. FIG. 4B is a view illustrating the (n−1)-th scan line SLn−1, the n-th scan line SLn, the (n+1)-th scan line SLn+, and the emission control line EL of FIG. 3. FIG. 4C is a view illustrating the initialization line IL and a capacitor electrode 201 of FIG. 3. FIG. 4D is a view illustrating the data line DL and the high potential line VDL of FIG. 3. FIG. 4E is a view illustrating the pixel electrode PE of FIG. 3. FIG. 4F is a view illustrating the semiconductor layer 321, the (n−1)-th scan line SLn−1, the n-th scan line SLn, the (n+1)-th scan line SLn+1, and the emission control line EL of FIG. 3, and FIG. 4G is a view illustrating a first connection electrode 701, a second connection electrode 702, a third connection electrode 703, the data line DL, the high potential line VDL, and a light blocking layer 190 of FIG. 3.

A display device according to an exemplary embodiment may include a substrate 100, a pixel circuit unit 200, a light blocking layer 190, a spacer 422, an LED, and a sealing portion 750, as illustrated in FIGS. 3 to 5.

As illustrated in FIGS. 3 and 4F, the first switching element T1 of the pixel circuit unit 200 includes a first gate electrode GE1, a first source electrode SE1 and a first drain electrode DE1.

As illustrated in FIGS. 3 and 4F, the second switching element 12 of the pixel circuit unit 200 includes a second gate electrode GE2, a second source electrode SE2 and a second drain electrode DE2.

As illustrated in FIGS. 3 and 4F, the third switching element T3 of the pixel circuit unit 200 includes a third gate electrode GE3, a third source electrode SE3 and a third drain electrode DE3.

As illustrated in FIGS. 3 and 4F, the fourth switching element T4 of the pixel circuit unit 200 includes a fourth gate electrode GE4, a fourth source electrode SE4 and a fourth drain electrode DE4.

As illustrated in FIGS. 3 and 4F, the fifth switching element T5 of the pixel circuit unit 200 includes a fifth gate electrode GE5, a fifth source electrode SE5 and a fifth drain electrode DE5.

As illustrated in FIGS. 3 and 4F, the sixth switching element T6 of the pixel circuit unit 200 includes a sixth gate electrode GE6, a sixth source electrode SE6 and a sixth drain electrode DE6.

As illustrated in FIGS. 3 and 4F, the seventh switching element T7 of the pixel circuit unit 200 includes a seventh gate electrode GE7, a seventh source electrode SE7 and a seventh drain electrode DE7.

The substrate 100 illustrated in FIG. 5 may include at least two layers. For example, in an exemplary embodiment, the substrate 100 may include a base layer 110, a first layer 111, a second layer 112, a third layer 113, and a fourth layer 114 arranged along a Z-axis direction. The first layer 111 is located between the base layer 110 and the second layer 112, the second layer 112 is located between the first layer 111 and the third layer 113, the third layer 113 is located between the second layer 112 and the fourth layer 114, and the fourth layer 114 is located between the third layer 113 and a buffer layer 120 of the pixel circuit unit 200.

The first layer 11l may have a thickness greater than a thickness of the second layer 112. As used herein, the thickness means a length from the top surface of the layer to the bottom surface of the layer measured in the Z-axis direction.

The third layer 113 may have a thickness greater than a thickness of the fourth layer 114.

The first layer 111 and the third layer 113 may have a substantially equal thickness.

The second layer 112 and the fourth layer 114 may have a substantially equal thickness.

In an exemplary embodiment, the base layer 110 may be a glass substrate or a film.

The first layer 111 may include or be formed of glass or transparent plastic. In addition, the first layer 111 may include an organic material. For example, in an exemplary embodiment, the first layer 111 may include one of: kapton, polyethersulphone ("PES"), polycarbonate ("PC"), polyimide ("PI"), polyethyleneterephthalate ("PET"), polyethylene naphthalate ("PEN"), polyacrylate ("PAR"), fiber reinforced plastic ("FRP") and the like.

The second layer 112 may include an inorganic material. For example, the second layer 112 may include or be formed of one of: a silicon nitride ($SiN_x$) layer, a silicon oxide ($SiO_2$) layer and an oxynitride ($SiO_xN_y$) layer.

The third layer 113 may include or be formed of a material substantially the same as a material included in the first layer 111 described above.

The fourth layer 114 may include or be formed of a material substantially the same as a material included in the second layer 112 described above.

As illustrated in FIG. 5, the pixel circuit unit 200 may be disposed on the substrate 100. For example, the pixel circuit unit 200 may be disposed on the fourth layer 114 of the substrate 100.

The pixel circuit unit 200 may include the buffer layer 120, the semiconductor layer 321, a gate insulating layer 140, the first gate electrode GE1, the second gate electrode GE2, the third gate electrode GE3, the fourth gate electrode GE4, the fifth gate electrode GE5, the sixth gate electrode GE6, the seventh gate electrode GE7, the (n−1)-th scan line SLn−1, the n-th scan line SLn, the (n+1)-th scan line SLn+1, the emission control line EL, a first insulating interlayer 150, the initialization line IL, a capacitor electrode 201, a second insulating interlayer 160, the first connection electrode 701, the second connection electrode 702, the third connection electrode 703, the data line DL, the high potential line VDL, and a planarization layer 180, for example.

The buffer layer 120 is disposed on the fourth layer 114 of the substrate 100. The buffer layer 120 may be disposed over an entire surface of the fourth layer 114. For example, the buffer layer 120 may overlap the entire surface of the fourth layer 114.

The buffer layer 120 serves to prevent permeation of undesirable elements and to planarize a surface therebelow. The buffer layer 120 may include suitable materials for planarizing and/or preventing permeation. For example, in an exemplary embodiment, the buffer layer 120 may include one of the following: a silicon nitride ($SiN_x$) layer, a silicon oxide ($SiO_2$) layer and a silicon oxynitride ($SiO_xN_y$) layer.

However, in certain exemplary embodiments, the buffer layer 120 may be omitted based on the type of the substrate 100 and process conditions thereof.

As illustrated in FIG. 5, the semiconductor layer 321 may be disposed on the butter layer 120.

As illustrated in FIG. 4A, the semiconductor layer 321 provides respective channel areas CH1, CH2, CH3, CH4, CH5, CH6 and CH7 of the first, second, third, fourth, fifth, sixth and seventh switching elements T1, T2, T3, T4, T5, T6 and T7. In addition, the semiconductor layer 321 provides the respective source electrodes SE1, SE2, SE3, SE4, SE5, SE6 and SE7 and the respective drain electrodes DE1, DE2, DE3, DE4, DE5, DE6 and DE7 of the first, second, third, fourth, fifth, sixth and seventh switching elements T1, T2, T3, T4, T5, T6 and T7.

The semiconductor layer 321 may include the first channel area CH1, the second channel area CH2, the third channel area CH3, the fourth channel area CH4, the fifth channel area CH5, the sixth channel area CH6, the seventh channel area CH7, the first source electrode SE1, the second source electrode SE2, the third source electrode SE3, the fourth source electrode SE4, the fifth source electrode SE5, the sixth source electrode SE6, the seventh source electrode SE7, the first drain electrode DE1, the second drain electrode DE2, the third drain electrode DE3, the fourth drain electrode DE4, the fifth drain electrode DE5, the sixth drain electrode DE6, and the seventh drain electrode DE7.

The first source electrode SE1, the second drain electrode DE2 and the fifth drain electrode DE5 are connected to each other. For example, in the exemplary embodiment shown in FIG. 4F, the first source electrode SE1, the second drain electrode DE2 and the fifth drain electrode DE5 may be unitarily formed as a single indivisible unit.

As shown in FIG. 4F, the first drain electrode DE1, the third source electrode SE3 and the sixth source electrode SE6 are connected to each other. For example, in the exemplary embodiment shown in FIG. 4F, the first drain electrode DE1, the third source electrode SE3 and the sixth source electrode SE6 may be unitarily formed as a single indivisible unit.

The third drain electrode DE3 and the fourth drain electrode DE4 are connected to each other. For example, in the exemplary embodiment shown in FIG. 4F, the third drain electrode DE3 and the fourth drain electrode DE4 may be unitarily formed as a single indivisible unit.

The sixth drain electrode DE6 and the seventh source electrode SE7 are connected to each other. For example, in the exemplary embodiment shown in FIG. 4F, the sixth drain electrode DE6 and the seventh source electrode SE7 may be unitarily formed as a single indivisible unit.

The semiconductor layer 321 may include a polycrystalline silicon layer, an amorphous silicon layer and an oxide semiconductor such as indium gallium zinc oxide (IGZO) or indium zinc tin oxide (IZTO). For example, in an embodiment in which the semiconductor layer 321 includes a polycrystalline silicon layer, the semiconductor layer 321 may include a channel area which is not doped with an impurity, and a source electrode and a drain electrode, on the opposite sides of the channel area, which are doped with impurities.

As illustrated in FIG. 5, the gate insulating layer 140 is disposed on the semiconductor layer 321 and the buffer layer 120. In an exemplary embodiment, the gate insulating layer 140 may include at least one of: tetraethylorthosilicate (TEOS), silicon nitride ($SiN_x$) and silicon oxide ($SiO_2$). For example, the gate insulating layer 140 may have a double-layer structure where a $SiN_x$ layer having a thickness of about 40 nm and a TEOS layer having a thickness of about 80 nm are sequentially stacked.

As illustrated in FIG. 5, the first gate electrode GE1 may be disposed on the gate insulating layer 140. For example, the first gate electrode GE1 may be located between the gate insulating layer 140 and the first insulating interlayer 150.

The second gate electrode GE2, the third gate electrode GE3, the fourth gate electrode GE4, the fifth gate electrode GE5, the sixth gate electrode GE6, and the seventh gate electrode GE 7 may also be disposed on the gate insulating layer 140. For example, the second, third, fourth, fifth, sixth and seventh gate electrodes GE2, GE3, GE4, GE5, GE6 and GE7 are located between the gate insulating layer 140 and the first insulating interlayer 150.

The scan lines and the emission control lines are also be disposed on the gate insulating layer 140. For example, the (n−1)-th scan line SLn−1, the n-th scan line SLn, the (n+1)-th scan line SLn+1 and the emission control line EL may be located between the gate insulating layer 140 and the first insulating interlayer 150.

As illustrated in FIGS. 3-5, the first gate electrode GE1 overlaps the first channel area CH1 of the semiconductor layer 321, the second gate electrode GE2 overlaps the second channel area CH2 of the semiconductor layer 321, the third gate electrode GE3 overlaps the third channel area CH3 of the semiconductor layer 321, the fourth gate electrode GE4 overlaps the fourth channel area CH4 of the semiconductor layer 321, the fifth gate electrode GE5 overlaps the fifth channel area CH5 of the semiconductor layer 321, the sixth gate electrode GE6 overlaps the sixth channel area CH6 of the semiconductor layer 321, and the seventh gate electrode GE7 overlaps the seventh channel area CH17 of the semiconductor layer 321.

As illustrated in FIGS. 4B and 4F, the fourth gate electrode GE4 is connected to the (n−1)-th scan line SLn−1. In this embodiment, the fourth gate electrode GE4 may be a portion of the (n−1)-th scan line SLn−1. For example, a portion of the (n−1)-th scan line SLn−1 that overlaps the semiconductor layer 321 may correspond to the fourth gate electrode GE4.

As illustrated in FIGS. 4B and 4F, the third gate electrode GE3 is connected to the n-th scan line SLn. In this embodiment, the third gate electrode GE3 may be a portion of the n-th scan line SLn. For example, a portion of the n-th scan line SLn that overlaps the semiconductor layer 321 may correspond to the third gate electrode GE3.

As illustrated in FIGS. 4B and 4F, the seventh gate electrode GE7 is connected to the (n+1)-th scan line SLn+1. In this embodiment, the seventh gate electrode GE7 may be a portion of the (n+1)-th scan line SLn+1. For example, a portion of the (n+1)-th scan line SLn+1 that overlaps the semiconductor layer 321 may correspond to the seventh gate electrode GE7.

As illustrated in FIGS. 4B and 4F, the fifth gate electrode GE5 and the sixth gate electrode GE6 are connected in common to one emission control line EL. In this embodiment, the fifth gate electrode GE5 and the sixth gate electrode GE6 may be portions of the emission control line EL. For example, two separate portions of the emission control line EL that overlap the semiconductor layer 321 may correspond to the fifth gate electrode GE5 and the sixth gate electrode GE6, respectively.

In an exemplary embodiment, the scan line (e.g., at least one of the (n−1)-th scan line SLn−1, the n-th scan line SLn and the (n+1)-th scan line SLn+1) may include at least one of: aluminum (Al) or alloys thereof, silver (Ag) or alloys thereof, copper (Cu) or alloys thereof and molybdenum (Mo) or alloys thereof. Alternatively, the scan line may include chromium (Cr), tantalum (Ta), and/or titanium (Ti). In an exemplary embodiment, the scan line may have a multilayer structure that includes at least two conductive layers that have different physical properties from each other.

The first, second, third, fourth, fifth, sixth and seventh gate electrodes GE1, GE2, GE3, GE4, GE5, GE6 and GE7 may include a substantially same material and have a substantially same structure (e.g., a multilayer structure) as those of the scan line described above. Each of the gate electrodes GE1, GE2, GE3, GE4, GE5, GE6 and GE7 and the scan line may be substantially simultaneously formed in a substantially same process.

In addition, the emission control line EL may include a substantially same material and have a substantially same structure (e.g., a multilayer structure) as those of the above-described scan line (e.g., SLn). The emission control line EL and the scan line may be substantially simultaneously formed in a substantially same process.

As illustrated in FIG. 5, the first insulating interlayer 150 may be disposed on the first gate electrode GE1 and the gate insulating layer 140. In an exemplary embodiment, the first insulating interlayer 150 may have a thickness that is greater than a thickness of the gate insulating layer 140. The first insulating interlayer 150 may include a material substantially the same as a material included in the gate insulating layer 140 described above.

The first insulating interlayer 150 may also be formed on the second, third, fourth, fifth, sixth and seventh gate electrodes GE2, GE3, GE4, GE5, GE6 and GE7, each scan line (e.g., scan lines SLn−1, SLn, and SLn+1) and the emission control line EL.

As illustrated in FIG. 5, a capacitor electrode 201 may be disposed on the first insulating interlayer 150. For example, the capacitor electrode 201 may be located between the first insulating interlayer 150 and a second insulating interlayer 160. The capacitor electrode 201 defines the storage capacitor Cst together with the first gate electrode GE1 described above. For example, the first gate electrode GE1 corresponds to a first electrode of the storage capacitor Cst, and the capacitor electrode 201 corresponds to a second electrode of the storage capacitor Cst. In an exemplary embodiment, a portion of the first gate electrode GE1 that overlaps the capacitor electrode 201 corresponds to the first electrode of the storage capacitor Cst, and a portion of the capacitor electrode 201 that overlaps the first gate electrode GE1 corresponds to the second electrode of the storage capacitor Cst.

The initialization line IL shown in FIGS. 3 and 4C may also be disposed on the first insulating interlayer 150. For example, the initialization line IL, may be located between the first insulating interlayer 150 and the second insulating interlayer 160.

As illustrated in FIGS. 3 and 4C, the capacitor electrode 201 includes a hole 30. In an exemplary embodiment, the hole 30 may have a quadrangular shape. However, in other embodiments, the shape of the hole 30 may have a variety of other shapes and is not limited to the quadrangle. For example, the holes 30 may have a circular shape, a triangular shape, etc.

As illustrated in FIGS. 3 and 4C, capacitor electrodes 201 of pixels adjacent to each other may be connected to each other. For example, the capacitor electrodes 201 of the pixels adjacent to each other in the X-axis direction may be unitarily formed as a single indivisible unit.

As illustrated in FIG. 5, the second insulating interlayer 160 may be disposed on the capacitor electrode 201, the initialization line IL, and the first insulating interlayer 150. For example, the second insulating interlayer 160 may be disposed directly on the capacitor electrode 201, the initialization line IL, and the first insulating interlayer 150. In an exemplary embodiment, the second insulating interlayer 160 may have a thickness that is greater than a thickness of the gate insulating layer 140. The second insulating interlayer 160 may include a material substantially the same as a material included in the gate insulating layer 140 described above.

As illustrated in FIG. 5, the first connection electrode 701, the second connection electrode 702, the high potential line VDL and the data line DL may be disposed on the second insulating interlayer 160. For example, the first connection electrode 701, the second connection electrode 702, the high potential line VDL and the data line DL may be located between the second insulating interlayer 160 and the planarization layer 180.

The third connection electrode 703 shown in FIGS. 3 and 4D may also be disposed on the second insulating interlayer 160. For example, the third connection electrode 703 may be located between the second insulating interlayer 160 and the planarization layer 180.

As illustrated in FIG. 5, the first connection electrode 701 is connected to the first source electrode SE1 through a first contact hole 11 which is defined through the second insulating interlayer 160, the first insulating interlayer 150 and the gate insulating layer 140.

As illustrated in FIG. 5, the second connection electrode 702 is connected to the first gate electrode GE1 through a second contact hole 12 which is defined through the second insulating interlayer 160 and the first insulating interlayer 150. In addition, as shown in FIGS. 3, 4A and 4D, the second connection electrode 702 is connected to the third drain electrode DE3 through a third contact hole 13. The third contact hole 13 is defined through the second insulating interlayer 160, the first insulating interlayer 150, and the gate insulating layer 140 to expose the third drain electrode DE3.

As illustrated in FIGS. 3, 4A and 4D, the third connection electrode 703 is connected to the fourth source electrode SE4 through a fourth contact hole 14. The fourth contact hole 14 is defined through the second insulating interlayer 160, the first insulating interlayer 150, and the gate insulating layer 140 to expose the fourth source electrode SE4. In addition, as illustrated in FIGS. 3, 4C and 4D, the third connection electrode 703 is connected to the initialization line IL through a fifth contact hole 15. The fifth contact hole 15 is defined through the second insulating interlayer 160 to expose the initialization line IL.

As illustrated in FIG. 5, the high potential line VDL is connected to the capacitor electrode 201 through a sixth contact hole 16 which is defined through the second insulating interlayer 160. In addition, as illustrated in FIGS. 3, 4A and 4D, the high potential line VDL is connected to the fifth source electrode SE5 through a seventh contact hole 17. The seventh contact hole 17 is defined through the second insulating interlayer 160, the first insulating interlayer 150 and the gate insulating layer 140 to expose the fifth source electrode SE5.

As illustrated in FIGS. 3, 4A and 4D, the data line DL is connected to the second source electrode SE2 through an eighth contact hole 18. The eighth contact hole 18 is defined through the second insulating interlayer 160, the first insulating interlayer 150 and the gate insulating layer 140 to expose the second source electrode SE2.

In an exemplary embodiment, the data line DL may include a refractory metal, such as molybdenum, chromium, tantalum and titanium, or an alloy thereof. The data line DL may have a multilayer structure including a refractory metal layer and a low-resistance conductive layer. Examples of the multilayer structure may include: a double-layer structure including a chromium or molybdenum (alloy) lower layer and an aluminum (alloy) upper layer; or a triple-layer structure including a molybdenum (alloy) lower layer, an aluminum (alloy) intermediate layer and a molybdenum (alloy) upper layer. In other exemplary embodiments, the data line DL may include any suitable metals or conductors other than the aforementioned materials.

The first connection electrode 701, the second connection electrode 702, the third connection electrode 703, and the high potential line VDL may include a substantially same material and have a substantially same structure (e.g., a multilayer structure) as those of the data line DL. The first connection electrode 701, the second connection electrode 702, the third connection electrode 703, the high potential line VDL, and the data line DL may be substantially simultaneously formed in a substantially same process.

As illustrated in FIG. 5, the planarization layer 180 may be disposed on the first connection electrode 701, the second connection electrode 702, the third connection electrode 703, the high potential line VDL and the data line DL.

The planarization layer 180 serves to eliminate a height difference in the layers below it. The planarization provided by the planarization layer 180 increase the luminous efficiency of the LED to be disposed thereon. In an exemplary embodiment, the planarization layer 180 may include at least one of: a polyacrylate resin, an epoxy resin, a phenolic resin, a polyamide resin, a polyimide resin, an unsaturated polyester resin, a polyphenylene ether resin, a polyphenylene sulfide resin and benzocyclobutene (BCB).

In an exemplary embodiment, the LED may be an OLED. The LED includes a light emitting layer 512, an anode electrode PE (hereinafter, "a pixel electrode") and a cathode electrode 613 (hereinafter, "a common electrode"), as illustrated in FIG. 5.

The light emitting layer 512 may include a low molecular weight organic material or a high molecular weight organic material. At least one of a hole injection layer and a hole transporting layer may further be disposed between the pixel electrode PE and the light emitting layer 512. At least one of an electron transporting layer ETL and an electron injection layer EIL may further be disposed between the light emitting layer 512 and the common electrode 613.

As illustrated in FIG. 5, the pixel electrode PE may be disposed on the planarization layer 180. A portion of or all of the pixel electrode PE may be located in a light emission area 900. For example, the pixel electrode PE may be located corresponding to the light emission area 900 that is defined by the light blocking layer 190 to be described below. As shown in FIGS. 3 and 5, the pixel electrode PE is connected to the first connection electrode 701 through a ninth contact hole 19 which is defined through the planarization layer 180.

In the exemplary embodiments shown in FIGS. 3 and 4E, the pixel electrode PE may have a rhombic shape. However, in other exemplary embodiments, the pixel electrode PE may have one of various shapes, such as a quadrangular shape, etc.

As illustrated in FIG. 5, the light blocking layer 190 may be disposed on the pixel electrode PE and the planarization layer 180. The light blocking layer 190 has an opening 900 which is defined through the light blocking layer. The opening 900 corresponds to the light emission area 900. In the exemplary embodiments shown in FIGS. 3 and 4G, the light emission area 900 may have a rhombic shape. However, in other exemplary embodiments, the light emission area 900 may have one of various shapes, such as a quadrangular shape, etc. A size of the light emission area 900 may be less than a size of the pixel electrode PE described above. At least a portion of the pixel electrode PE is located at the light emission area 900. In this embodiment, the entirety of the light emission area 900 overlaps the pixel electrode PE.

In an exemplary embodiment, the light blocking layer 190 may include a resin, such as a polyacrylate resin, a polyimide resin, etc.

The spacer 422 may be disposed on the light blocking layer 190. The spacer 422 may include or be formed of a material substantially the same as a material included in the light blocking layer 190. The spacer 422 serves to substantially minimize a height difference between a layer located at the display area 100a of the substrate 100 and a layer located at the non-display area 100b of the substrate 100.

The light emitting layer 512 may be disposed on the pixel electrode PE at the light emission area 900. The common electrode 613 may be disposed on the light blocking layer 190 and the light emitting layer 512.

The pixel electrode PE and the common electrode 613 may be formed as one of a transmissive electrode, a transflective electrode and a reflective electrode.

In an exemplary embodiment, the transmissive electrode may include a transparent conductive oxide ("TCO"). The TCO may include at least one of: indium tin oxide ("ITO"), indium zinc oxide ("IZO"), antimony tin oxide ("ATO"), aluminum zinc oxide ("AZO"), zinc oxide ("ZnO"), and mixtures thereof.

In an exemplary embodiment, the transflective electrode and the reflective electrode may include a metal, e.g., magnesium (Mg), silver (Ag), gold (Au), calcium (Ca), lithium (Li), chromium (Cr), aluminum (Al) and copper (Cu), or an alloy thereof. In this embodiment, the thickness of the electrode may determine whether the electrode is a transflective type or a reflective type. For example, a transflective electrode has a thickness of about 200 nm or less. In contrast, a reflective electrode has a thickness of about 300 nm or more. As the thickness of the transflective electrode decreases, the light transmittance and resistance increases. As the thickness of the transflective electrode increases, the light transmittance decreases.

In this embodiment, the transflective electrode and the reflective electrode may have a multilayer structure which includes a metal layer including a metal or a metal alloy and a TCO layer stacked on the metal layer.

A capping layer 810 may be disposed on the common electrode 613. The capping layer 810 may be disposed on the common electrode 613 to overlap an entire surface of the substrate 100. In this embodiment, the capping layer 810 may be disposed between the common electrode 613 and a protective layer 820. In an exemplary embodiment, the capping layer 810 may be an organic layer 755 that includes an organic material.

The protective layer 820 may be disposed on the capping layer 810. For example, the protective layer 820 may be disposed directly on the capping layer 810. The protective layer 820 may be disposed on the capping layer 810 to overlap the entire surface of the substrate 100. In this embodiment, the protective layer 820 may be disposed between the capping layer 810 and the sealing portion 750. In an exemplary embodiment, the protective layer 820 may include LiF.

However, in some exemplary embodiments, at least one of the capping layer 810 and the protective layer 820 may be omitted.

The sealing portion 750 may be disposed on the protective layer 820. The sealing portion 750 may include a transparent insulating substrate. In an exemplary embodiment, the transparent insulating substrate may be glass, transparent plastic, etc. In addition, the sealing portion 750 may be formed to have a thin film encapsulation structure in which one or more inorganic layers and one or more organic layers are alternately disposed in a laminated structure (e.g., along the Z-axis direction). For example, as shown in the exemplary embodiment of FIG. 5, the sealing portion 750 may include a lower inorganic layer 751, an organic layer 755, and an upper inorganic layer 752. The organic layer 755 is disposed between the lower inorganic layer 751 and the upper inorganic layer 752 (e.g., in the Z-axis direction). However, in alternative embodiments, the sealing portion 750 may include different amounts of inorganic layers and organic layers which may be arranged in a variety of different manners. Furthermore, the inorganic layers and/or the organic layers may have a plurality of sub-layers.

In an exemplary embodiment, the organic layer 755 may have a greater thickness than the lower inorganic layer 751 and the upper inorganic layer 752. The lower inorganic layer 751 and the upper inorganic layer 752 may have a substantially equal thickness. For example, at least one of the lower inorganic layer 751 and the upper inorganic layer 752 may have a thickness in a range from about 5000 Å to about 7000 Å, where the thickness means a length from a top surface of the layer to a bottom surface of the layer in the Z-axis direction. However, in alternative embodiments, the thicknesses of the lower inorganic layer 751, upper inorganic layer 752 and organic layer 755 may vary. For example, the organic layer 755 may have a thickness substantially equal to one or more of the inorganic layers or one or more inorganic layers may have a greater thickness than another inorganic layer or the organic layer.

The lower inorganic layer 751 and the upper inorganic layer 752 may include or be formed of a material substantially the same as a material included in the second layer 112 described above.

The organic layer 755 may include or be formed of a material substantially the same as a material included in the first layer 111. In addition, the organic layer 755 may include a monomer.

Figure 6:
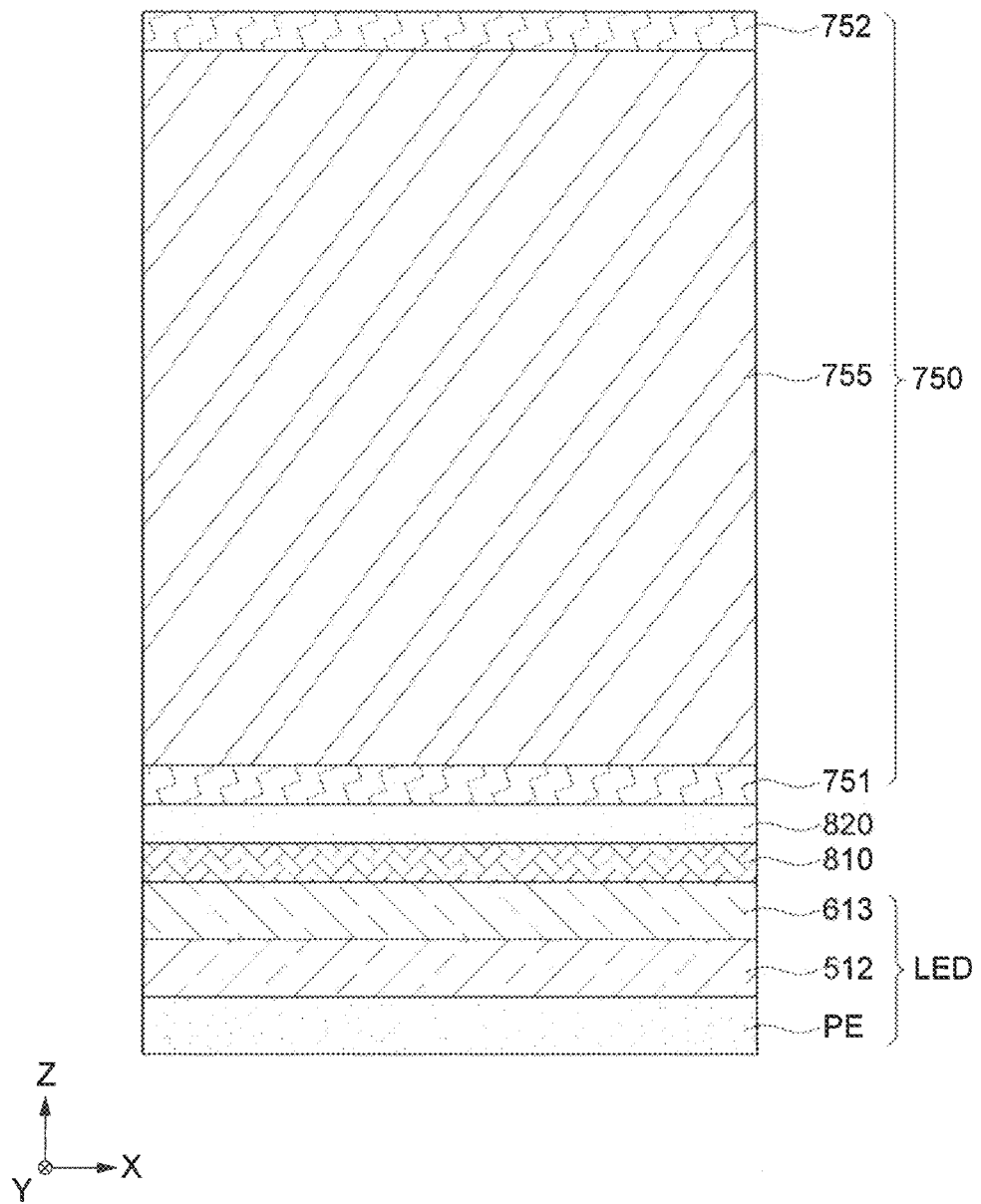
FIG. 6 is an enlarged view illustrating portion A in FIG. 5.

FIG. 6 is an enlarged view illustrating portion A in FIG. 5.

At least one inorganic layer included in the sealing portion 750 may include hydrogen and SiON, such as hydrogenated silicon oxynitride (SiON:H). For example, in the exemplary embodiment shown in FIG. 6, at least one of the lower inorganic layer 751 and the upper inorganic layer 752 may include SiON:H.

In an exemplary embodiment, only the inorganic layer (hereinafter, "uppermost inorganic layer") disposed at an uppermost portion of the plurality of inorganic layers included in the sealing portion 750 may include SiON:H. For example, in the exemplary embodiment shown in FIG. 6, only the upper inorganic layer 752 which corresponds to the uppermost inorganic layer may include SiON:H and the lower inorganic layer 751 does not include SiON:H.

At least one inorganic layer included in the sealing portion 750 may include each of silicon (Si), oxygen (O), nitrogen (N), and hydrogen (H). For example, at least one of the lower inorganic layer 751 and the upper inorganic layer 752 of the exemplary embodiment shown in FIG. 6 may include each of silicon, oxygen, nitrogen, and hydrogen. In an exemplary embodiment, the upper inorganic layer 752, which is the uppermost inorganic layer, may include silicon, nitrogen, hydrogen, and oxygen.

In an exemplary embodiment, the at least one of the lower inorganic layer 751 and the upper inorganic layer 752 that includes each of silicon, oxygen, nitrogen and hydrogen may have a chemical composition in which the content of silicon is about 30-40 atomic percent (at %), the content of oxygen is about 15-35 at %, the content of nitrogen is about 10-20 at % and the content of hydrogen is 20-30 at %. For example, the silicon content may be about 35 at %, the oxygen content may be about 25 at %, the nitrogen content may be about 15 at %, and the hydrogen content may be about 25 at %.

An upper inorganic layer 752 having a silicon content of about 30-40 at %, an oxygen content of about 15-35 at %, a nitrogen content of about 10-20 at %, and a hydrogen content of about 20-30 at % may have a refractive index in a range from about 1.47 to about 1.70. For example, the upper inorganic layer 752 having a silicon content of about 35 at %, an oxygen content of about 25 at %, a nitrogen content of about 15 at %, and a hydrogen content of about 25 at % may have a refractive index in a range from about 1.47 to about 1.70.

The upper inorganic layer 752 having such a chemical composition ratio substantially minimizes a deviation in light transmission variation according to wavelength of the light transmitted from the light emitting layer, which will be described in detail with reference to FIG. 7.

Figure 7:
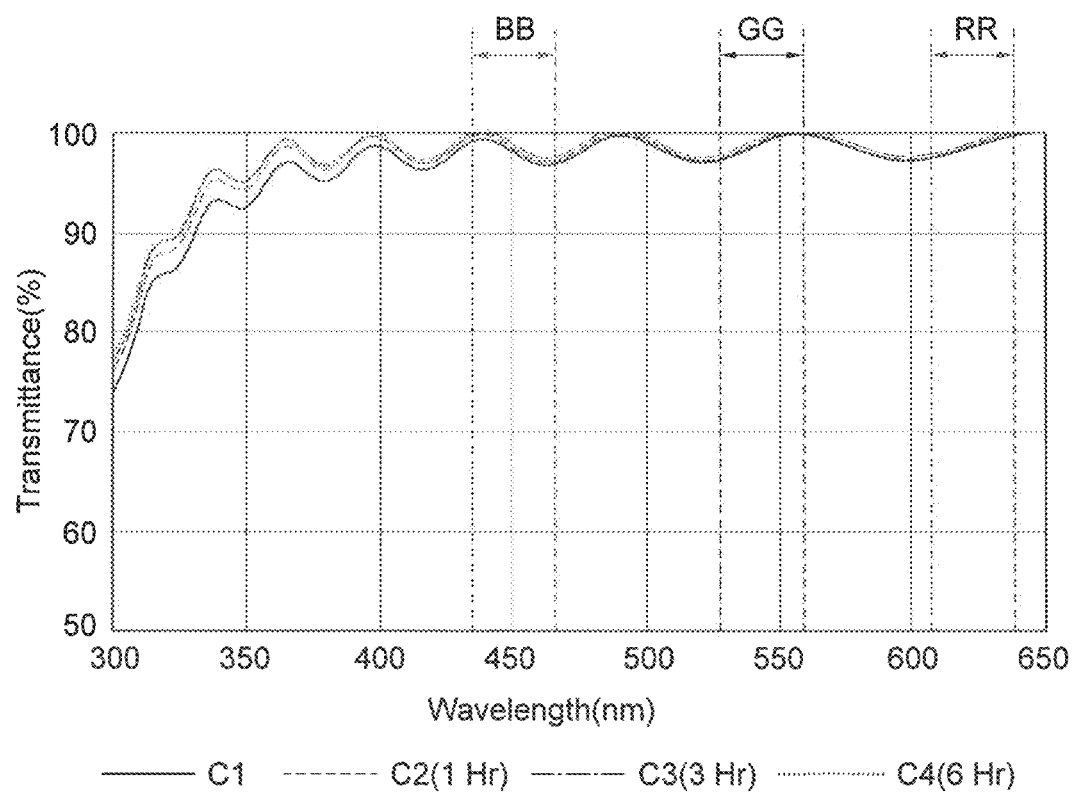
FIG. 7 is a graph showing a light transmittance variation of an upper inorganic layer according to wavelength of light.

FIG. 7 is a graph showing a light transmittance variation of an upper inorganic layer according to a wavelength of light.

A first curve C1 represents a light transmittance of the upper inorganic layer 752 which is not irradiated with sunlight according to a wavelength of the light transmitted from the light emitting layer. A second curve C2 represents a light transmittance of the upper inorganic layer 752 which is irradiated with sunlight for 1 hour, according to a wavelength of the light transmitted from the light emitting layer. A third curve C3 represents a light transmittance of the upper inorganic layer 752 which is irradiated with sunlight for 3 hours according to a wavelength of the light transmitted from the light emitting layer. A fourth curve C4 represents a light transmittance of the upper inorganic layer 752 which is irradiated with sunlight for 6 hours according to a wavelength of the light transmitted from the light emitting layer.

As used herein, the light transmittance means a light transmittance with respect to light emitted from the light emitting layer 512. For example, a light transmittance in a blue light wavelength region BB means the light transmittance of the upper inorganic layer 752 with respect to a blue light emitted from a blue light emitting layer, a light transmittance in a green light wavelength region GG means the light transmittance of the upper inorganic layer 752 with respect to a green light emitted from a green light emitting layer, and a light transmittance in a red light wavelength region RR means the light transmittance of the upper inorganic layer 752 with respect to a red light emitted from a red light emitting layer.

As illustrated in FIG. 7, there is a difference between the light transmittance of the upper inorganic layer 752 which has been irradiated with sunlight for 1 hour as compared with the upper inorganic layer that has not been irradiated with sunlight. The difference in the light transmittance indicated by the first curve C1 and the second curve C2 in the blue light wavelength region BB (hereinafter, "blue light transmittance variation"), the green light wavelength region GG (hereinafter, "green light transmittance variation"), and the red light wavelength region RR (hereinafter, "red light transmittance variation") are substantially equal to each other. For example, the light transmittance of the second curve C2 is greater than the light transmittance of the first curve C1 by an average of about 0.4% in the blue light wavelength region BB, the light transmittance of the second curve C2 is greater than the light transmittance of the first curve C1 by an average of about 0.2% in the green light wavelength region GG, and the light transmittance of the second curve C2 is greater than the light transmittance of the first curve C1 by an average of about 0.2% in the red light wavelength region RR. The curve C3 indicating light transmittance of the upper inorganic layer 752 which has been irradiated with sunlight for 3 hours and the curve C4 indicating light transmittance of the upper inorganic layer which has been irradiated with sunlight for 6 hours are both similar to the curve C2. Therefore, the differences between the light transmittances indicated by curve C3 and curve C4 as compared to C1 are similar to the differences between the light transmittances of curve C2 and curve C1. For example, the light transmittance of the third curve C3 and fourth curve C4 is greater than the light transmittance of the first curve C1 by an average of about 0.4% in the blue light wavelength region BB, about 0.2% in the green light wavelength region GG, and about 0.2% in the red light wavelength region RR.

Accordingly, the deviation in light transmittance variation according to wavelength of sunlight may be substantially minimized in the upper inorganic layer 752. Therefore, a color inequality of the image displayed by the display device due to sunlight exposure may be substantially minimized.

Figure 8:
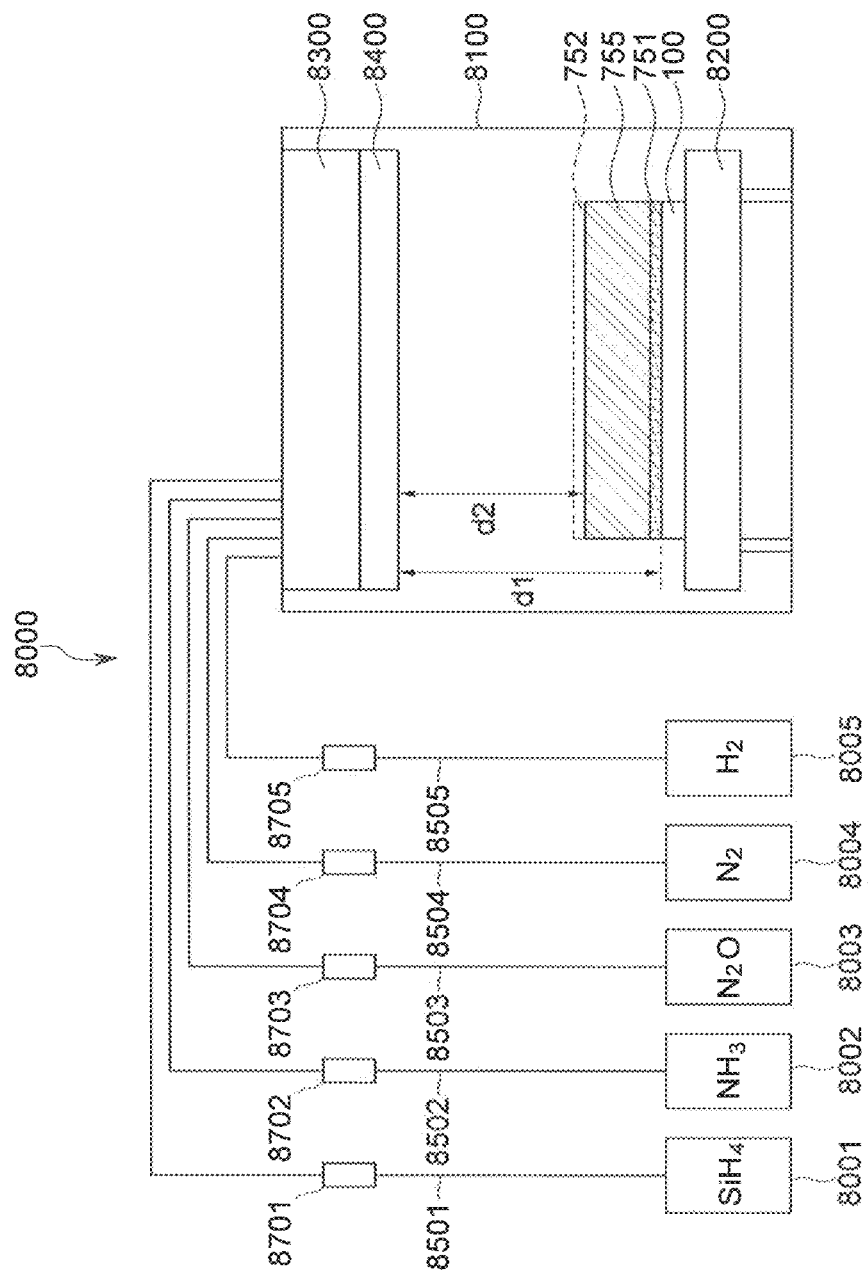
FIG. 8 is an elevational view illustrating an apparatus for performing a method of manufacturing a display device according to an exemplary embodiment.

FIG. 8 is an elevational view illustrating an apparatus for performing a method of manufacturing a display device according to an embodiment with respect to FIG. 6.

A deposition apparatus 8000 of FIG. 8 may be a chemical vapor deposition (CVD) apparatus. The deposition apparatus 8000 of FIG. 8 may include a chamber 8100, a stage 8200, a gas mixing unit 8300, a gas injecting unit 8400, a first gas supply unit 8001, a second gas supply unit 8002, a third gas supply unit 8003, a fourth gas supply unit 8004, a fifth gas supply unit 8005, a first gas supply pipe 8501, a second gas supply pipe 8502, a third gas supply pipe 8503, a fourth gas supply pipe 8504, a fifth gas supply pipe 8505, a first flow rate controller 8701, a second flow rate controller 8702, a third flow rate controller 8703, a fourth flow rate controller 8704, and a fifth flow rate controller 8705.

The stage 8200, the gas mixing unit 8300, and the gas injecting unit 8400 may be disposed in the chamber 8100. However, in other exemplary embodiments, the gas mixing unit 8300 or the gas injecting unit 8400 may be disposed outside of the chamber.

The first gas supply unit 8001, the second gas supply unit 8002, the third gas supply unit 8003, the fourth gas supply unit 8004, the fifth gas supply unit 8005, the first gas supply pipe 8501, the second gas supply pipe 8502, the third gas supply pipe 8503, the fourth gas supply pipe 8504, the fifth gas supply pipe 8505, the first flow rate controller 8701, the second flow rate controller 8702, the third flow rate controller 8703, the fourth flow rate controller 8704, and the fifth flow rate controller 8705 may be disposed outside the chamber 8100. However, in other exemplary embodiments, one or more of these devices may be disposed inside the chamber.

The stage 8200 supports the substrate 100. In other words, the substrate 100 is placed inside the chamber 8100 in a position so that it is disposed on the stage 8200. In an exemplary embodiment, a portion of the layers of the sealing portion 750 may be disposed on the substrate 100 prior to placing the substrate inside the chamber 8100. For example, in an embodiment, at least one of the lower inorganic layer 751 and the organic layer 755 may be disposed on the substrate 100 prior to placing the substrate inside the chamber 8100.

The first gas supply unit 8001 may supply $SiH_4$. The first gas supply unit 8001 may include a first storage unit, and $SiH_4$ may be stored in a gas form in the first storage unit.

The second gas supply unit 8002 may supply $NH_3$. The second gas supply unit 8002 may include a second storage unit, and $NH_3$ may be stored in a gas form in the second storage unit.

The third gas supply unit 8003 may supply $N_2O$. The third gas supply unit 8003 may include a third storage part, and $N_2O$ may be stored in a gas form in the third storage part.

The fourth gas supply unit 8004 may supply $N_2$. The fourth gas supply unit 8004 may include a fourth storage unit, and $N_2$ may be stored in a gas form in the fourth storage unit.

The fifth gas supply unit 8005 may supply $H_2$. The fifth gas supply unit 8004 may include a fifth storage unit, and $H_2$ may be stored in a gas form in the fifth storage unit.

While an exemplary embodiment describes the inorganic layer including each of silicon (Si), oxygen (O), nitrogen (N), and hydrogen (H) as being manufactured by a vapor deposition process that utilizes a mixed gas supplied from $SiH_4$, $NH_3$, $N_2O$, $N_2$, and $H_2$, in other exemplary embodiments, the silicon, oxygen, nitrogen and hydrogen may be provided from a mixed gas supplied by various other combinations of gases.

The first gas supply pipe 8501 is connected to the first gas supply unit 8001 and the gas mixing unit 8300. For example, one end portion of the first gas supply pipe 8501 is connected to the first gas supply unit 8001, and another end portion of the first gas supply pipe 8501 is connected to the gas mixing unit 8300. The first gas supply pipe 8501 supplies the $SiH_4$ gas from the first gas supply unit 8001 to the gas mixing unit 8300. The $SiH_4$ gas from the first gas supply unit 8001 may flow into the gas mixing unit 8300 through the first gas supply pipe 8501. In this embodiment, a flow rate of the $SiH_4$ gas in the first gas supply pipe 8501 may be, for example, in a range from about 495 standard cubic centimeter per minute (sccm) to about 1485 sccm. In another exemplary embodiment, the flow rate of the $SiH_4$ gas in the first gas supply pipe is in a range of about 740 sccm to about 1240 sccm.

The second gas supply pipe 8502 is connected to the second gas supply unit 8002 and the gas mixing unit 8300. For example, one end portion of the second gas supply pipe 8502 is connected to the second gas supply unit 8002, and another end portion of the second gas supply pipe 8502 is connected to the gas mixing unit 8300. The second gas supply pipe 8502 supplies the $NH_3$ gas from the second gas supply unit 8002 to the gas mixing unit 8300. The $NH_3$ gas from the second gas supply unit 8002 may flow into the gas mixing unit 8300 through the second gas supply pipe 8502. In this embodiment, a flow rate of the $NH_3$ gas in the second gas supply pipe 8502 may be, for example, in a range from about 250 sccm to about 750 sccm. In another exemplary embodiment, the flow rate of the $NH_3$ gas is in a range of about 350 sccm to about 600 sccm.

The third gas supply pipe 8503 is connected to the third gas supply unit 8003 and the gas mixing unit 8300. For example, one end portion of the third gas supply pipe 8503 is connected to the third gas supply unit 8003, and another end portion of the third gas supply pipe 8503 is connected to the gas mixing unit 8300. The third gas supply pipe 8503 supplies the $N_2O$ gas from the third gas supply unit 8003 to the gas mixing unit 8300. The $N_2O$ gas from the third gas supply unit 8003 may flow into the gas mixing unit 8300 through the third gas supply pipe 8503. In this embodiment, a flow rate of the $N_2O$ gas in the third gas supply pipe 8503 may be, for example, in a range from about 1330 sccm to about 3990 sccm. In another exemplary embodiment, the flow rate of the $N_2O$ gas is about 2000 sccm to about 3320 sccm.

In an embodiment, the flow rate of the $N_2O$ gas may be about five times the flow rate of the $NH_3$ gas or more. For example, when the flow rate of the $NH_3$ gas is in a range from about 250 sccm to about 750 sccm as described above, the flow rate of the $N_2O$ gas may be in a range from about 1350 sccm to about 3750 sccm. In other words, the $N_2O$ gas from the third gas supply unit 8003 may be supplied to the gas mixing unit 8300 at a flow rate in a range from about 1350 sccm to about 3750 sccm.

The fourth gas supply pipe 8504 is connected to the fourth gas supply unit 8004 and the gas mixing unit 8300. For example, one end portion of the fourth gas supply pipe 8504 is connected to the fourth gas supply unit 8004, and another end portion of the fourth gas supply pipe 8504 is connected to the gas mixing unit 8300. The fourth gas supply pipe 8504 supplies the $N_2$ gas from the fourth gas supply unit 8004 to the gas mixing unit 8300. The $N_2$ gas from the fourth gas supply unit 8004 may flow into the gas mixing unit 8300 through the fourth gas supply pipe 8504. In this embodiment, the flow rate of the $N_2$ gas in the fourth gas supply pipe 8504 may be, for example, in a range from about 4930 sccm to about 14790 sccm. In another exemplary embodiment, the flow rate of the $N_2$ gas is about 7395 sccm to about 12325 sccm.

The fifth gas supply pipe 8505 is connected to the fifth gas supply unit 8005 and the gas mixing unit 8300. For example, one end portion of the fifth gas supply pipe 8505 is connected to the fifth gas supply unit 8005, and another end portion of the fifth gas supply pipe 8505 is connected to the gas mixing unit 8300. The fifth gas supply pipe 8505 supplies the $H_2$ gas from the fifth gas supply unit 8005 to the gas mixing unit 8300. The $H_2$ gas from the fifth gas supply unit 8005 may flow into the gas mixing unit 8300 through the fifth gas supply pipe 8505. In this embodiment, the flow rate of the $H_2$ gas in the fifth gas supply pipe 8505 may be, for example, in a range from about 5635 sccm to about 16905 sccm. In another exemplary embodiment, the flow rate of the $H_2$ gas may be about 8450 sccm to about 14085 sccm.

The first flow rate controller 8701 may be disposed at a portion of the first gas supply pipe 8501. The first flow rate controller 8701 controls the flow rate of the $SiH_4$ gas flowing along the first gas supply pipe 8501. For example, the $SiH_4$ gas may flow along the first gas supply pipe 8501 at the aforementioned flow rate ranging from about 495 sccm to about 1485 sccm by the first flow rate controller 8701.

The second flow rate controller 8702 may be disposed at a portion of the second gas supply pipe 8502. The second flow rate controller 8702 controls the flow rate of the $NH_3$ gas flowing along the second gas supply pipe 8502. For example, the $NH_3$ gas may flow along the second gas supply pipe 8502 at the aforementioned flow rate ranging from about 250 sccm to about 750 sccm by the second flow rate controller 8702.

The third flow rate controller 8703 may be disposed at a portion of the third gas supply pipe 8503. The third flow rate controller 8703 controls the flow rate of the $N_2O$ gas flowing along the third gas supply pipe 8503. For example, the $N_2O$ gas may flow along the third gas supply pipe 8503 at the aforementioned flow rate ranging from about 1330 sccm to about 3990 sccm by the third flow rate controller 8703.

The fourth flow rate controller 8704 may be disposed at a portion of the fourth gas supply pipe 8504. The fourth flow rate controller 8704 controls the flow rate of the $N_2$ gas flowing along the fourth gas supply pipe 8504. For example, the $N_2$ gas may flow along the fourth gas supply pipe 8504 at the aforementioned flow rate ranging from about 4930 to about 14790 sccm by the fourth flow rate controller 8704.

The fifth flow rate controller 8705 may be disposed at a portion of the fifth gas supply pipe 8505. The fifth flow rate controller 8705 controls the flow rate of the $H_2$ gas flowing along the fifth gas supply pipe 8505. For example, the $H_2$ gas may flow along the fifth gas supply pipe 8505 at the aforementioned flow rate ranging from about 5635 to about 16905 sccm by the fifth flow rate controller 8705. However, in certain exemplary embodiments, one or more of the supply pipes or flow rate controllers may be combined with another supply pipe or flow rate controller and may not be independent.

The $SiH_4$ gas from the first gas supply pipe 8501, the $NH_3$ gas from the second gas supply pipe 8502, the $N_2O$ gas from the third gas supply pipe 8503, the $N_2$ gas from the fourth gas supply pipe 8504, and the $H_2$ gas from the fifth gas supply pipe 8505 are mixed together in the gas mixing unit 8300. The mixed gas delivered to the gas injecting unit is sprayed (e.g., injected) onto the substrate 100 through the gas injecting unit 8400. For example, the mixed gas is sprayed onto the organic layer 755. The mixed gas is sprayed onto the substrate from a lower surface of the gas injecting unit 8400. However, in other embodiments, the gas injecting unit 8400 may be positioned on a side of the substrate or below the substrate and the mixed gas is sprayed onto the substrate from a side surface of the gas injecting unit or an upper surface of the gas injecting unit, respectively.

The gas injecting unit 8400 may include a shower head. The shower head sprays the mixed gas from the gas mixing unit 8300 toward the substrate 100. In such an embodiment, a distance d1 between the gas injecting unit 8400 and the substrate 100 may be, for example, in a range from about 475 mils to about 1425 mils. As an example, the distance d1 between the gas injecting unit 8400 and the substrate 100 may be about 950 mils. In an exemplary embodiment, a distance d2, instead of the distance d1, may be, for example, in a range from about 475 mils to 1425 mils, or more particularly, about 950 mils. In the exemplary embodiments, the distance d2 may be defined as a distance between the gas ejection unit 8400 and the uppermost layer (e.g., the organic layer 755) located farthest from the substrate 100 of the layers disposed on the substrate 100.

In an exemplary embodiment, a plasma gas is included between the gas injecting unit 8400 and the substrate 100, and the mixed gas passes through the plasma gas to be deposited on the organic layer 755. A radio frequency (RF) power of a power source of the chamber 8100 may be used to generate the above-described plasma gas. The radio frequency may be, for example, in a range from about 1600 W to about 4800 W. For example, the RF power may be about 3200 W.

When the mixed gas injected from the gas injecting unit 8400 is deposited on the organic layer 755, the upper inorganic layer 752 including SiON:H is formed on the organic layer 755. In this embodiment, the upper inorganic layer 752 includes silicon (Si), oxygen (O), nitrogen (N) and hydrogen (H), and contents of the silicon, the oxygen, the nitrogen, and the hydrogen may be about 30-40 at %, about 15-35 at %, about 10-20 at %, and about 20-30 at %, respectively. For example, the silicon content may be about 35 at %, the oxygen content may be about 25 at %, the nitrogen content may be about 15 at %, and the hydrogen content may be about 25 at %.

An internal pressure of the chamber 8100 may be, for example, in a range from about 600 mtorr to about 1800 mtorr. For example, the internal pressure of the chamber 8100 may be about 1200 mtorr. In other words, the internal pressure of the chamber 8100 by the mixed gas supplied into the chamber 8100 at the above-described flow rate may be about 1200 mtorr.

In an exemplary embodiment, the lower inorganic layer 751 may also be manufactured in the same manner as in the upper inorganic layer 752 described above. The lower inorganic layer 751 may be manufactured by a mixed gas of a $SiH_4$ gas, a $NH_3$ gas, a $N_2O$ gas, a $N_2$ gas, and a $H_2$ gas deposited on the substrate in the chamber. In this embodiment, a flow rate of each gas, a distance d1 or d2 between the gas injecting unit 8400 and the substrate 100, an RF power of the power source of the chamber 8100, and an internal pressure of the chamber 8100 may have the above-described values, respectively. However, if the stage 8200 is not adjusted, the distance d2 between the gas ejection unit and the uppermost layer may be greater (e.g., in an amount equal to the thickness of the organic layer 755) when depositing the lower inorganic layer 751 as compared to the upper inorganic layer 752. In an exemplary embodiment, when the lower inorganic layer 751 is manufactured, the flow rate of the $SiH_4$ gas may range from about 495 sccm to about 1485 sccm, the flow rate of the $NH_3$ gas may range from about 250 sccm to about 750 sccm, the flow rate of the $N_2O$ gas may range from about 1330 sccm to about 3990 sccm, the flow rate of the $N_2$ gas may range from about 4930 sccm to about 14790 sccm, the flow rate of the $H_2$ gas may range from about 5635 sccm to about 16905 sccm, the distance d1 or d2 between the gas injecting unit 8400 and the substrate 100 may range from about 475 mils to about 1425 mils (or about 950 mils), the RF power of the chamber 8100 may range from about 1600 W to about 4800 W (or about 3200 W), and the internal pressure of the chamber 8100 may range from about 600 mtorr to about 1800 mtorr (or about 1200 mtorr). In addition, the composition ratio of silicon, oxygen, nitrogen, and hydrogen included in the lower inorganic layer 751 may be substantially the same as the above-described composition ratio of silicon, oxygen, nitrogen, and hydrogen included in the upper inorganic layer 752, respectively. However, in alternative embodiments, the components and composition ratio of the lower inorganic layer 751 may differ from the upper inorganic layer 752.

Figure 9:
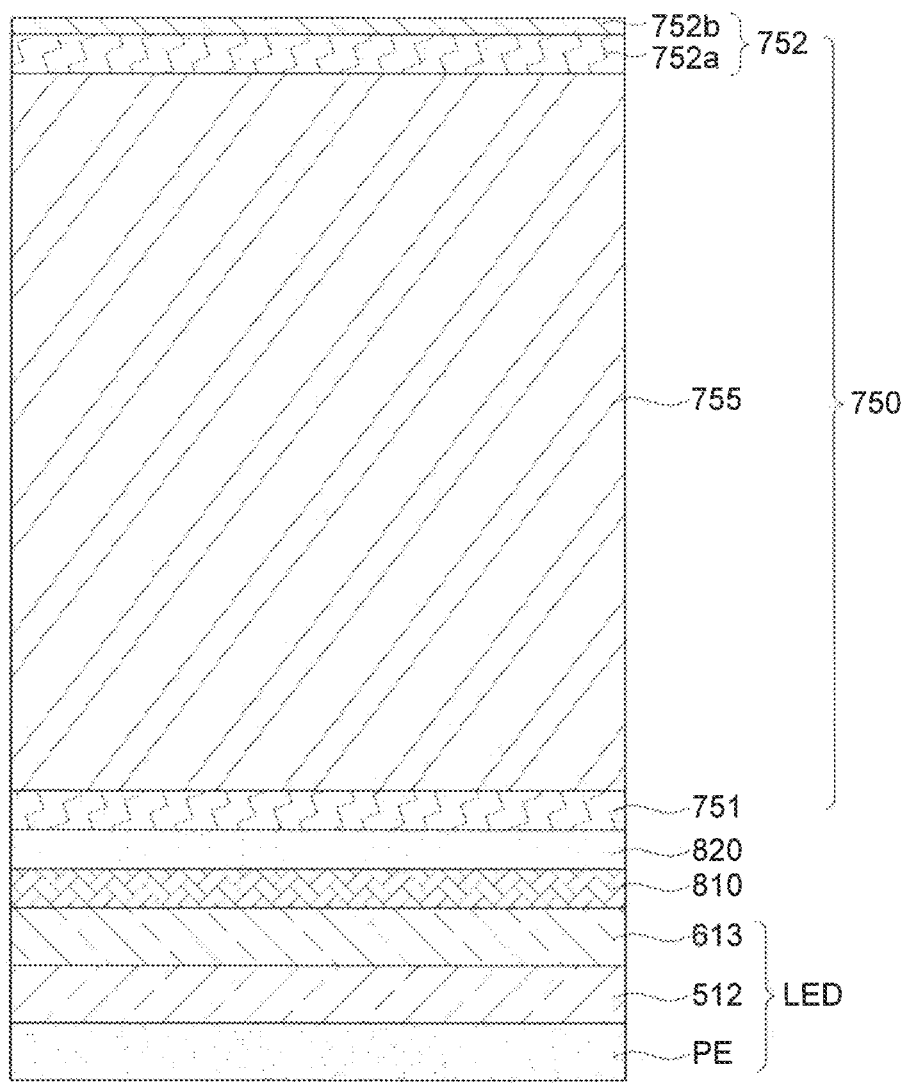
FIG. 9 is an enlarged view illustrating portion A in FIG. 5 according to another exemplary embodiment.

FIG. 9 is an enlarged view illustrating portion A in FIG. 5 according to another exemplary embodiment.

At least one inorganic layer included in the sealing portion 750 illustrated in FIG. 9 may include hydrogen and SiON. For example, at least one inorganic layer included in the sealing portion 750 may include SiON:H. In an exemplary embodiment, at least one of the lower inorganic layer 751 and the upper inorganic layer 752 may include SiON:H. In this embodiment, the upper inorganic layer 752, which is the uppermost inorganic layer, may include at least two sub-inorganic layers 752a and 752b. For example, the upper inorganic layer 752 may include a first sub-inorganic layer 752a and a second sub-inorganic layer 752b. The second sub-inorganic layer 752b may serve as a barrier to prevent moisture permeation into the first sub-inorganic layer 752a.

In an exemplary embodiment, only the uppermost inorganic layer may include SiON:H. For example, only the upper inorganic layer 752 which corresponds to the uppermost inorganic layer among the lower inorganic layer 751 and the upper inorganic layer 752 may include SiON:H. As a more specific example, only the first sub-inorganic layer 752a of the upper inorganic layer 752 which is the uppermost inorganic layer may include SiON:H.

At least one inorganic layer included in the sealing portion 750 may include silicon (Si), oxygen (O), nitrogen (N), and hydrogen (H). For example, at least one of the lower inorganic layer 751 and the upper inorganic layer 752 may include silicon, oxygen, nitrogen, and hydrogen. In an exemplary embodiment, only the first sub-inorganic layer 752a of the upper inorganic layer 752 which is the uppermost inorganic layer may include silicon, oxygen, nitrogen, and hydrogen.

The first sub-inorganic layer 752a may have the following chemical composition in which the contents of the silicon, the oxygen, the nitrogen, and the hydrogen included in the first sub-inorganic layer 752a may be about 30-40 at %, about 15-35 at %, about 10-20 at %, and about 20-30 at %, respectively. For example, in the first sub-inorganic layer 752a, the silicon content may be about 30-40 at %, the oxygen content may be about 10-20 at %, the nitrogen content may be about 10-20 at %, and the hydrogen content may be about 20-30 at %. In an exemplary embodiment, in the first sub-inorganic layer 752a, the silicon content may be about 35 at %, the oxygen content may be about 25 at %, the nitrogen content may be about 15 at %, and the hydrogen content may be about 25 at %.

The first sub-inorganic layer 752a having such a chemical composition ratio may have a refractive index in a range from about 1.47 to about 1.70. As an example, the first sub-inorganic layer 752a having a silicon content of about 30-40 at %, an oxygen content of about 15-35 at %, a nitrogen content of about 10-20 at %, and a hydrogen content of about 20-30 at % may have a refractive index in a range from about 1.47 to about 1.70. As another example, the first sub-inorganic layer 752a having a silicon content of about 35 at %, an oxygen content of about 25 at %, a nitrogen content of about 15 at %, and a hydrogen content of about 25 at % may have a refractive index in a range from about 1.47 to about 1.70.

In an exemplary embodiment, the first sub-inorganic layer 752a may be substantially the same as the upper inorganic layer 752 of FIG. 6 described above.

The second sub-inorganic layer 752b of the upper inorganic layer 752 which is the uppermost inorganic layer may be disposed on the first sub-inorganic layer 752a.

In an exemplary embodiment, the second sub-inorganic layer 752b may include hydrogenated silicon nitride (SiNx:H).

The second sub-inorganic layer 752b may include silicon (Si), nitrogen (N), and hydrogen (H). In an exemplary embodiment, the second sub-inorganic layer 752b does not include oxygen (O).

The second sub-inorganic layer 752b may have the following chemical composition. For example, contents of the silicon, the nitrogen, and the hydrogen included in the second sub-inorganic layer 752b may be about 30-50 at %, about 30-50 at %, and about 20-30 at %, respectively. For example, in the second sub-inorganic layer 752b, the silicon content may be about 30-50 at %, the nitrogen content may be about 30-50 at %, and the hydrogen content may be about 20-30 at %. In an exemplary embodiment, the second sub-inorganic layer 752b, the silicon content may be about 40 at %, the nitrogen content may be about 40 at %, and the hydrogen content may be about 20 at %. As another example, in the second sub-inorganic layer 752b, the silicon content may be about 30 at %, the nitrogen content may be about 50 at %, and the hydrogen content may be about 20 at %.

The second sub-inorganic layer 752b having such a chemical composition ratio may have a refractive index higher than that of the first sub-inorganic layer 752a described above. For example, the second sub-inorganic layer 752b may have a refractive index in a range from about 1.70 to about 2.10. In an exemplary embodiment, the second sub-inorganic layer 752b may have a refractive index of about 1.89. For example, the second sub-inorganic layer 752b having the silicon content of about 30-50 at %, the nitrogen content of about 30-50 at %, and the hydrogen content of about 20-30 at % may have a refractive index of about 1.89. In another example, the second sub-inorganic layer 752b having the silicon content of about 40 at %, the nitrogen content of about 40 at %, and the hydrogen content of about 20 at % may have a refractive index of about 1.89. As another example, the second sub-inorganic layer 752b having the silicon content of about 30 at %, the nitrogen content of about 50 at %, and the hydrogen content of about 20 at % may have a refractive index of about 1.89.

By using at least one of the first sub-inorganic layer 752a and the second sub-inorganic layer 752b having such a chemical composition ratio, the sealing layer 750 substantially minimizes a deviation in light transmission variation according to the wavelength of the light transmitted from the light emitting layer as shown in FIG. 7.

In an exemplary embodiment, the first sub-inorganic layer 752a may have a thickness in a range from about 5000 Å to about 7000 Å, and the second sub-inorganic layer 752b may have a thickness substantially equal to or less than about 2000 Å. However, exemplary embodiments are not limited thereto and the first sub-inorganic layer 752a and second sub-inorganic layer 752b may have a thickness that is the about same size or the second sub-inorganic layer may have a larger thickness than the first sub-inorganic layer.

Figure 10:
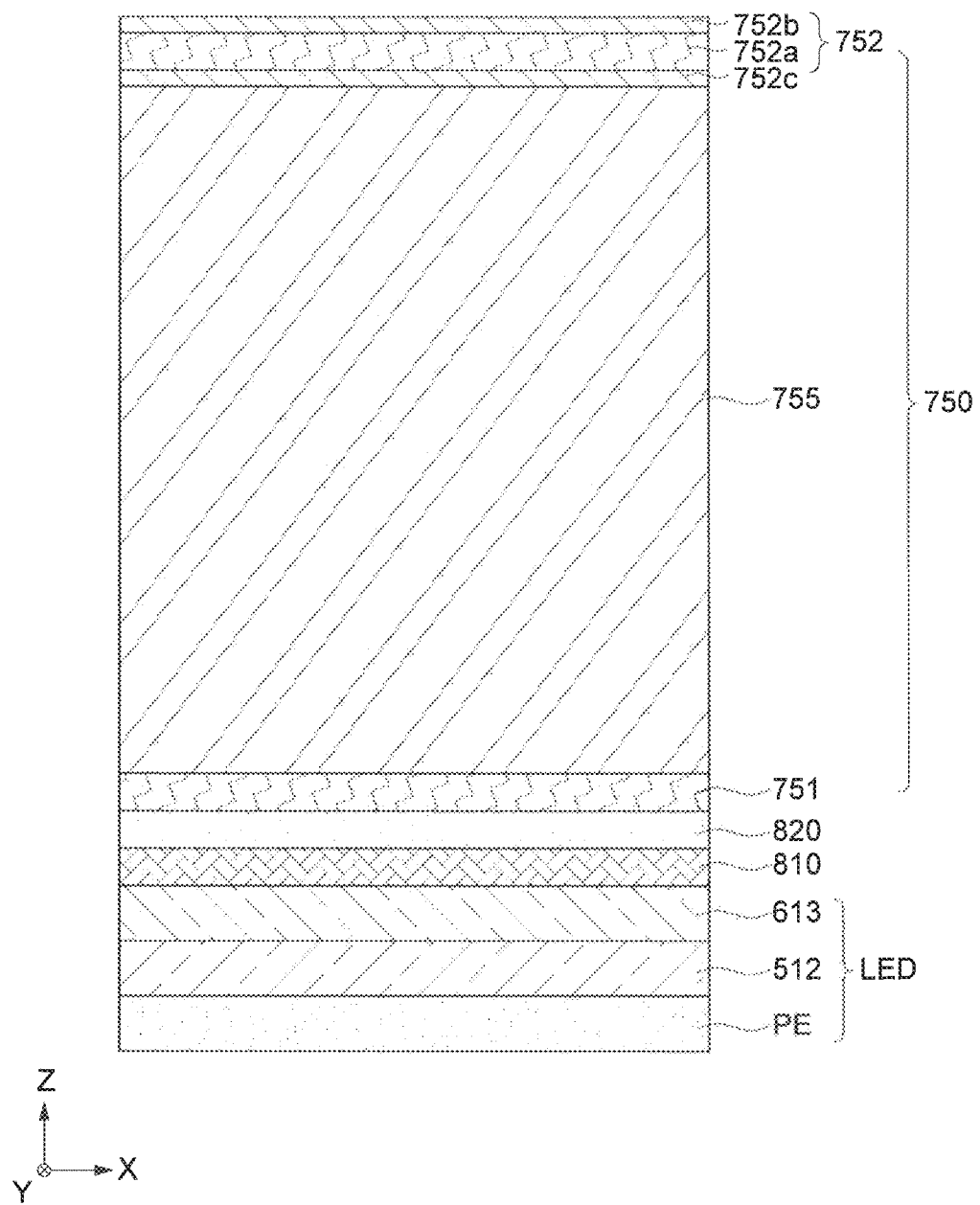
FIG. 10 is an enlarged view illustrating portion A in FIG. 5 according to another exemplary embodiment.

FIG. 10 is an enlarged view illustrating portion A in FIG. 5 according to another exemplary embodiment.

At least one inorganic layer included in the sealing portion 750 illustrated in FIG. 10 may include hydrogen and SiON, such as SiON:H. For example, at least one of the lower inorganic layer 751 and the upper inorganic layer 752 may include SiON:H. In this embodiment, the upper inorganic layer 752, which is the uppermost inorganic layer, may include at least two sub-inorganic layers. For example, the upper inorganic layer 752 may include three sub-inorganic layers including a first sub-inorganic layer 752a, a second sub-inorganic layer 752b, and a third sub-inorganic layer 752c. The third sub-inorganic layer 752c may serve to protect the organic layer 755 disposed below the first sub-inorganic layer 752a during the deposition of the first sub-inorganic layer 752a. Damage of the organic layer 755 due to the deposition of the first sub-inorganic layer 752a may be substantially minimized by the third sub-inorganic layer 752c.

The first sub-inorganic layer 752a and the second sub-inorganic layer 752b in FIG. 10 are substantially the same as the first sub-inorganic layer 752a and the second sub-inorganic layer 752b in FIG. 9 described above, respectively. Therefore, the description related to the first sub-inorganic layer 752a and the second sub-inorganic layer 752b of FIG. 10 will refer to the above description with reference to FIG. 9.

The third sub-inorganic layer 752c of the upper inorganic layer 752 which is the uppermost inorganic layer may be disposed below the first sub-inorganic layer 752a. For example, the third sub-inorganic layer 752c may be disposed between the organic layer 755 and the first sub-inorganic layer 752a.

The third sub-inorganic layer 752c may include hydrogenated silicon nitride (SiNx:H).

The third sub-inorganic layer 752c may include silicon (Si), nitrogen (N), and hydrogen (H).

The third sub-inorganic layer 752c may have a chemical composition in which the silicon content may be about 30-50 at %, the nitrogen content may be about 30-50 at %, and the hydrogen content may be about 20-30 at %. For example, in the third sub-inorganic layer 752c, the silicon content may be about 40 at %, the nitrogen content may be about 40 at %, and the hydrogen content may be about 20 at %. In another example, in the third sub-inorganic layer 752c, the silicon content may be about 30 at %, the nitrogen content may be about 50 at %, and the hydrogen content may be about 20 at %.

The third sub-inorganic layer 752c having such a chemical composition ratio may have a refractive index higher than that of the first sub-inorganic layer 752a described above. For example, the third sub-inorganic layer 752c may have a refractive index in a range from about 1.70 to about 2.10. The third sub-inorganic layer 752c may have a refractive index of about 1.85. The third sub-inorganic layer 752c having the silicon content of about 30-50 at %, the nitrogen content of about 30-50 at %, and the hydrogen content of about 20-30 at % may have a refractive index of about 1.85. The third sub-inorganic layer 752c having the silicon content of about 40 at %, the nitrogen content of about 40 at %/o, and the hydrogen content of about 20 at % may have a refractive index of about 1.85. The third sub-inorganic layer 752c having the silicon content of about 30 at %, the nitrogen content of about 50 at %, and the hydrogen content of about 20 at % may have a refractive index of about 1.85.

The chemical composition ratio of the third sub-inorganic layer 752c may be substantially the same as the chemical composition ratio of the second sub-inorganic layer 752b described above. However, the second sub-inorganic layer 752b and the third sub-inorganic layer 752c are manufactured under different conditions. For example, the second sub-inorganic layer 752b and the third sub-inorganic layer 752c may be manufactured under different levels of the RF power and different levels of the gas pressure. Therefore, a density (or film density) of the second sub-inorganic layer 752b may be different from a density (or film density) of the third sub-inorganic layer 752c. For example, the second sub-inorganic layer 752b may have a density greater than a density of the third sub-inorganic layer 752b. Due to the density difference, the refractive index of the second sub-inorganic layer 752b may be different from the refractive index of the third sub-inorganic layer 752c, even though the second sub-inorganic layer 752b and the third sub-inorganic layer 752c include substantially same materials and have a substantially same chemical composition ratio. For example, the second sub-inorganic layer 752b may have a refractive index higher than that of the third sub-inorganic layer 752c.

In an embodiment, the density of the first sub-inorganic layer 752a may be greater than the density of the third sub-inorganic layer 752c, and less than the density of the second sub-inorganic layer 752b.

By using at least one of the first, second, and third sub-inorganic layers 752a, 752b, and 752c having such a chemical composition ratio, the sealing layer substantially minimizes a deviation in light transmission variation according to the wavelength of the light transmitted from the light emitting layer as shown in FIG. 7.

In an exemplary embodiment, the third sub-inorganic layer 752c may have a thickness substantially equal to or less than about 500 Å. As an exemplary embodiment, the thickness of the first sub-inorganic layer 752a may be about 5000 Å, the thickness of the second sub-inorganic layer 752b may be about 2000 Å, and the thickness of the third sub-inorganic layer 752c may be about 500 Å. However, in other exemplary embodiments, the thicknesses may vary.

Figure 11A:
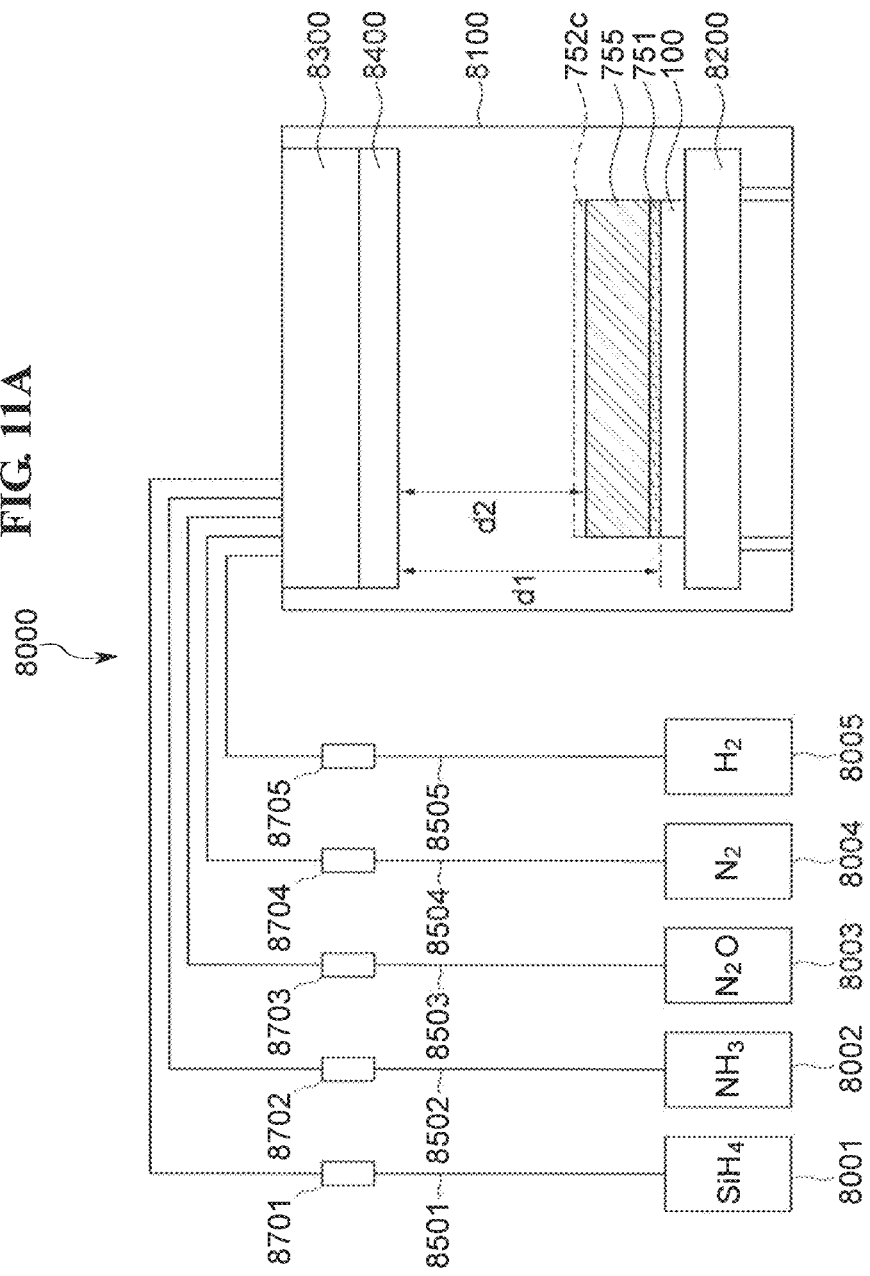
FIGS. 11A to 11C are views illustrating an apparatus for performing a method of manufacturing a display device according to an exemplary embodiment.
Figure 11B:
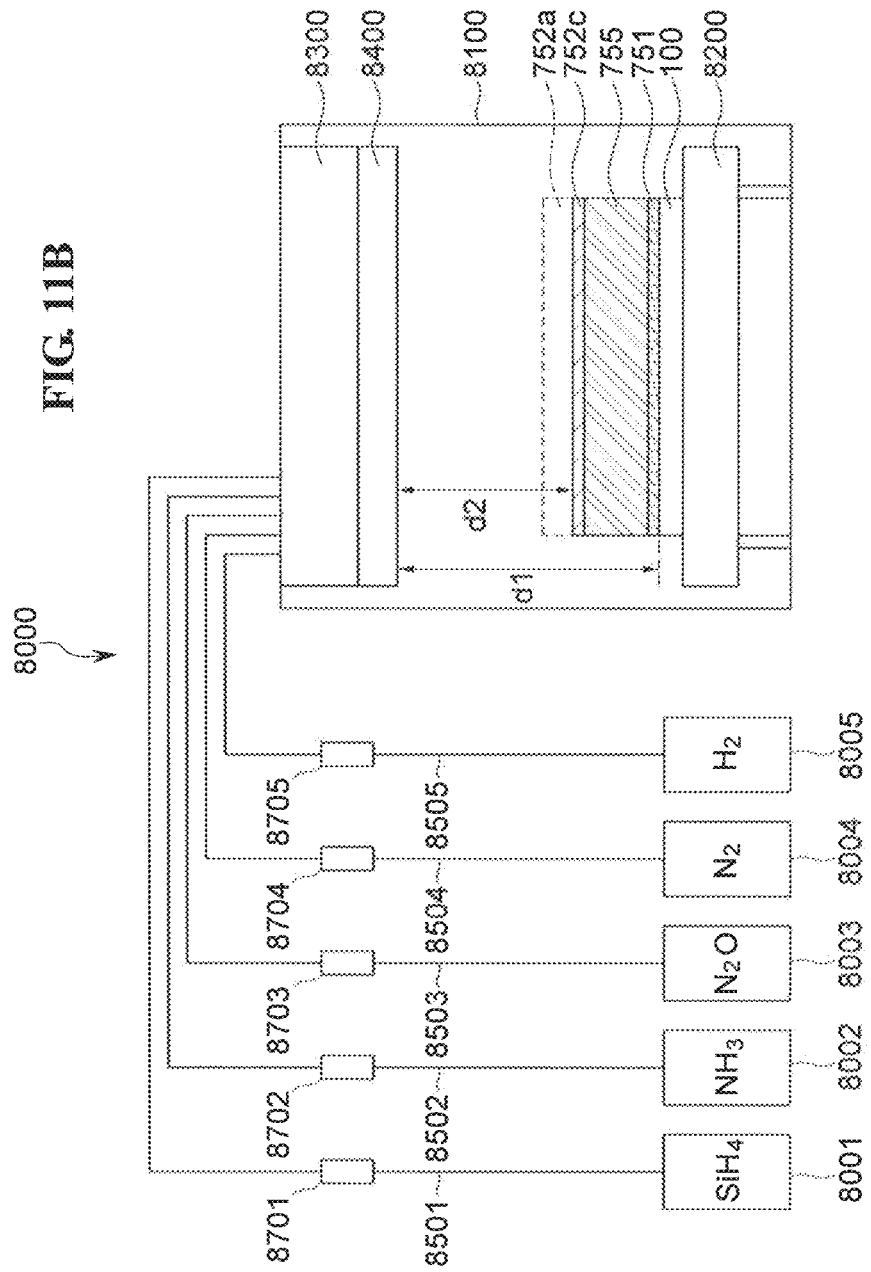
Figure 11C:
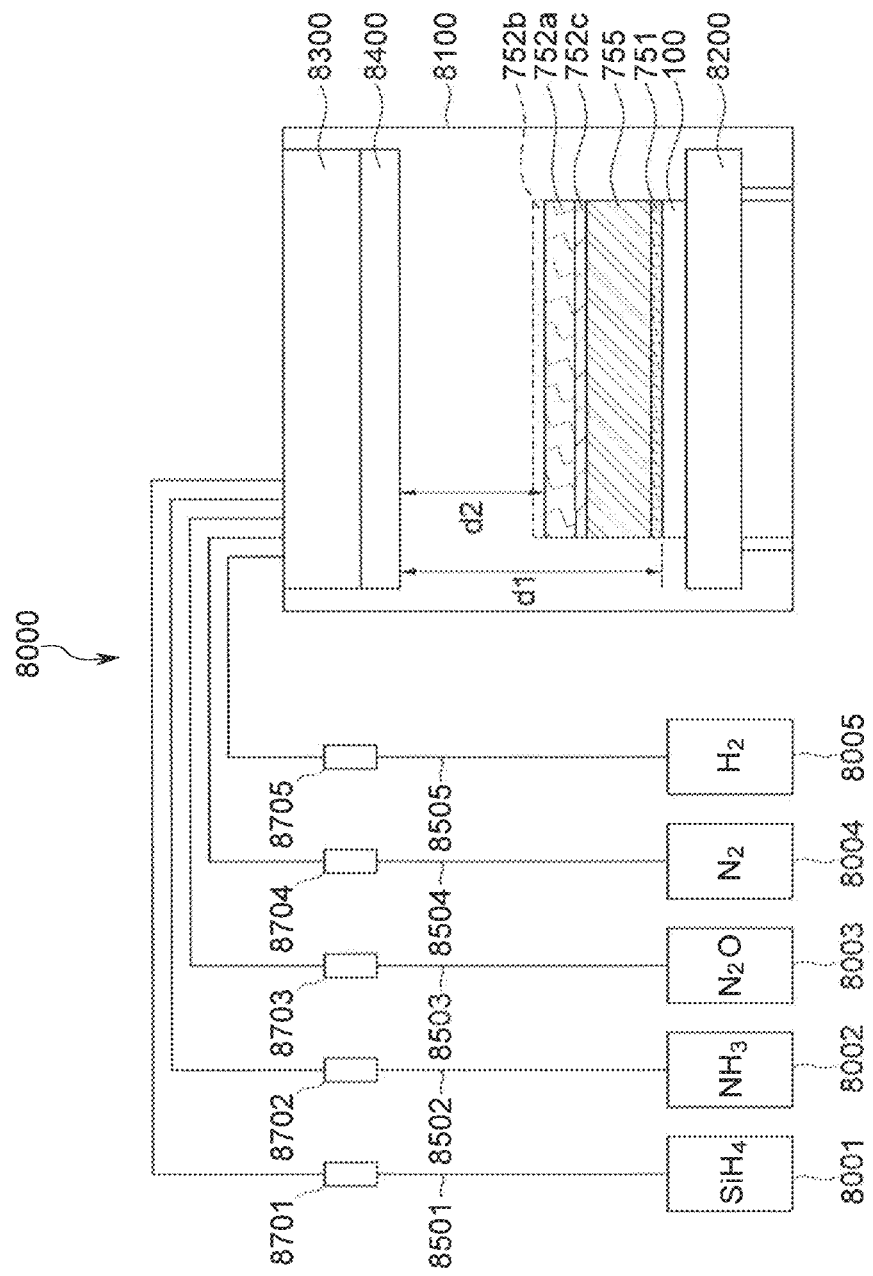

FIGS. 11A to 11C are elevational views illustrating a method of manufacturing a display device according to an embodiment with respect to FIG. 10.

A method of manufacturing the upper inorganic layer 752 of FIG. 10 will be described below with reference to FIGS. 11A to 11C. The deposition apparatus 8000 shown in FIGS. 11A to 11C is substantially the same as the deposition apparatus 8000 of FIG. 8 described above, and thus the description of the deposition apparatus 8000 of FIGS. 11A to 11C will refer to that in FIG. 8.

As illustrated in FIG. 11A, the third sub-inorganic layer 752c of the sealing portion 752 is formed on the organic layer 755. The third sub-inorganic layer 752c may be manufactured by a mixed gas of a $H_2$ gas, a $N_2$ gas, a $NH_3$ gas, and a $SiH_4$ gas. In this embodiment, a flow rate of the $H_2$ gas may range from about 6715 sccm to about 20145 sccm, a flow rate of the $N_2$ gas may range from about 2520 sccm to about 7560 sccm, a flow rate of the $NH_3$ gas may range from about 670 sccm to about 2010 sccm, a flow rate of the $SiH_4$ gas may range from about 420 sccm to about 1260 sccm, a distance d1 or d2 between the gas injecting unit 8400 and the substrate 100 may range from about 475 mils to about 1425 mils (or about 950 mils), a RF power of the chamber 8100 may range from about 750 W to about 2250 W (or about 1500 W), and an internal pressure of the chamber 8100 may range from about 1000 mtorr to about 3000 mtorr (or about 2000 mtorr). In an exemplary embodiment, the $N_2O$ gas may not be used in fabricating the third sub-inorganic layer 752c and the third sub-inorganic layer may not include oxygen.

The composition ratio of silicon, nitrogen, and hydrogen included in the third sub-inorganic layer 752c may be substantially the same as the composition ratio of silicon, nitrogen, and hydrogen included in the third sub-inorganic layer 752c of FIG. 10.

As illustrated in FIG. 11B, the first sub-inorganic layer 752a is formed on the third sub-inorganic layer 752c. The first sub-inorganic layer 752a may be formed in the same manner as in the upper inorganic layer 752 of FIG. 6 described above. The fabricating method of the first sub-inorganic layer 752a will refer to the above description with reference to FIG. 8. In this embodiment, the distance d2 between the gas injecting unit 8400 and the substrate 100 may be defined as a distance between the gas injecting unit 8400 and the uppermost layer (e.g., the top surface of the third sub-inorganic layer 752c) located farthest from the substrate 100 of the layers disposed on the substrate 100.

As illustrated in FIG. 11C, the second sub-inorganic layer 752b is formed on the first sub-inorganic layer 752a. The second sub-inorganic layer 752b may be fabricated by the deposition of a mixed gas of a $H_2$ gas, a $N_2$ gas, a $NH_3$ gas, and a $SiH_4$ gas. In this embodiment, a flow rate of the $H_2$ gas in the supply pipe may range from about 6715 sccm to about 20145 sccm, a flow rate of the $N_2$ gas in the supply pipe may range from about 2520 sccm to about 7560 sccm, a flow rate of the $NH_3$ gas in the supply pipe may range from about 670 sccm to about 2010 sccm, a flow rate of the $SiH_4$ gas in the supply pipe may range from about 420 sccm to about 1260 sccm, a distance d1 or d2 between the gas injecting unit 8400 and the substrate 100 may range from about 475 mils to about 1425 mils (or about 950 mils), a RF power of the chamber 8100 may range from about 1500 W to about 4500 W (or about 3000 W), and an internal pressure of the chamber 8100 may range from about 750 mtorr to about 2250 mtorr (or about 1500 mtorr). In an exemplary embodiment, the $N_2O$ gas may not be used in fabricating the first sub-inorganic layer 752a and the first sub-inorganic layer may not include oxygen.

In this embodiment, the distance d2 between the gas injecting unit 8400 and the substrate 100 in FIG. 11C may be defined as a distance between the gas injecting unit 8400 and the uppermost layer (e.g., the top surface of the first sub-inorganic layer 752a) located farthest from the substrate 100 of the layers disposed on the substrate 100.

The composition ratio of silicon, nitrogen, and hydrogen included in the second sub-inorganic layer 752b may be substantially the same as the composition ratio of silicon, nitrogen, and hydrogen included in the second sub-inorganic layer 752b of FIG. 9.

In an exemplary embodiment, the lower inorganic layer 751 may include a plurality of sub-inorganic layers. For example, the lower inorganic layer 751 may include the first, second, and third sub-inorganic layers 752a. 752b, and 752c described above. In this embodiment, the first, second, and third sub-inorganic layers of the lower inorganic layer 751 may be substantially the same as the first, second, and third sub-inorganic layers 752a, 752b, and 752c of the upper inorganic layer 752, respectively.

In an exemplary embodiment, the lower inorganic layer 751, the organic layer 755 and the upper inorganic layer 752 may be fabricated in different chambers. For example, the lower inorganic layer 751 may be formed in a separate and distinct first chamber. The display device including the lower inorganic layer 751 may be transported into a separate and distinct second chamber, and the organic layer 755 may be formed in the second chamber. The display device including the lower inorganic layer 751 and the organic layer 755 may be transported into a separate and distinct third chamber, and the upper inorganic layer 752 may be formed in the third chamber. When the upper inorganic layer 752 includes the plurality of sub-inorganic layers (e.g., 752a, 752b, and 752c), the plurality of sub-inorganic layers 752a, 752b, and 752c may be sequentially formed in the same third chamber. However, in alternative exemplary embodiments, the display device may be moved to a separate and distinct chamber for deposition of one or more of the layers of the upper inorganic layer 752.

As set forth hereinabove, in a display device according to the exemplary embodiments, the display device substantially minimizes a deviation in light transmittance variation according to wavelength of the light transmitted from the light emitting layer. Accordingly, a color inequality of the image generated by the display device due to exposure to sunlight may be substantially minimized in the display device.

While the present invention has been illustrated and described with reference to the exemplary embodiments thereof, it will be apparent to those of ordinary skill in the art that various changes in form and detail may be made thereto without departing from the spirit and scope of the exemplary embodiments.

What is claimed is:

1. A display device comprising:
   a substrate;
   a light emitting layer on the substrate;
   a common electrode on the light emitting layer;
   a capping layer disposed directly on the common electrode, the capping layer comprising an organic material;
   a protective layer disposed directly on the capping layer, the protective layer including LiF, wherein a portion of the protective layer overlapping the light emitting layer has a lower height from the substrate than heights of uppermost surfaces of the common electrode and the capping layer from the substrate; and
   a sealing portion disposed directly on the protective layer, wherein the sealing portion comprises a first inorganic layer,
   the first inorganic layer comprises at least one layer including silicon, oxygen, nitrogen and hydrogen, and
   the at least one layer of the first inorganic layer includes a content of silicon of about 30-40 (at %), a content of oxygen of about 15-35 at %, a content of nitrogen of about 10-20 at %, a content of hydrogen of about 20-30 at %,
   wherein the light emitting layer is between the substrate and the first inorganic layer, and
   the capping layer is between the sealing portion and the light emitting layer.

2. The display device of claim 1, wherein the content of silicon is about 35 at %, the content of oxygen is about 25 at %, the content of nitrogen is about 15 at %, and the content of hydrogen is about 25 at % in the at least one layer of the first inorganic layer.

3. The display device of claim 1, wherein the at least one layer of the first inorganic layer comprises SiON:H.

4. The display device of claim 1, wherein the sealing portion further comprises a second inorganic layer, and
   the second inorganic layer is disposed between the first inorganic layer and the light emitting layer.

5. The display device of claim 1, wherein the sealing portion further comprises at least one organic layer.

6. The display device of claim 5, wherein the at least one organic layer is disposed between the first inorganic layer and a second inorganic layer.

7. The display device of claim 1, wherein the at least one layer of the first inorganic layer has a refractive index substantially equal to or lower than about 1.70.

8. The display device of claim 1, wherein the first inorganic layer comprises at least two sub-inorganic layers.

9. The display device of claim 8, wherein the at least two sub-inorganic layers comprise a first sub-inorganic layer on the light emitting layer, and
   at least one of a second sub-inorganic layer on the first sub-inorganic layer, and a third sub-inorganic layer below the first sub-inorganic layer.

10. The display device of claim 9, wherein the first sub-inorganic layer includes a content of silicon of about 30-40 at %, a content of oxygen of about 15-35 at %, a content of nitrogen of about 10-20 at %, and a content of hydrogen of about 20-30 at %.

11. The display device of claim 10, wherein:
    at least one of the second sub-inorganic layer and the third sub-inorganic layer comprises silicon, nitrogen, and hydrogen; and
    the content of silicon is about 30-50 at %, the content of nitrogen is about 30-50 at % and the content of hydrogen is about 20-30 at % in the at least one of the second sub-inorganic layer and the third sub-inorganic layer.

12. The display device of claim 11, wherein the content of silicon is about 40 at %, the content of nitrogen is about 40 at %, and the content of hydrogen is about 20 at % in the at least one of the second sub-inorganic layer and the third sub-inorganic layer.

13. The display device of claim 11, wherein the content of silicon is about 30 at %, the content of nitrogen is about 50 at %, and the content of hydrogen is about 20 at % in the at least one of the second sub-inorganic layer and the third sub-inorganic layer.

14. The display device of claim 9, wherein the first sub-inorganic layer comprises SiON:H, and
    at least one of the second sub-inorganic layer and the third sub-inorganic layer comprises SiNx:H.

15. The display device of claim 9, wherein the first sub-inorganic layer, the second sub-inorganic layer, and the third sub-inorganic layer have different refractive indices from each other.

16. The display device of claim 15, wherein:
    the first sub-inorganic layer has a refractive index in a range from about 1.47 to about 1.70; and
    the second sub-inorganic layer and the third sub-inorganic layer have a refractive index higher than the refractive index of the first sub-inorganic layer.

17. A display device comprising:
    a substrate;
    a light emitting layer on the substrate;
    a common electrode on the light emitting layer;
    a capping layer disposed directly on the common electrode, the capping layer comprising an organic material; and
    a sealing portion disposed on the capping layer,
    wherein:
    the sealing portion comprises a first inorganic layer,
    the first inorganic layer comprises a plurality of sub-inorganic layers disposed adjacent to each other,
    one of the plurality of sub-inorganic layers includes a content of silicon of about 30-40 at %, a content of oxygen of about 15-35 at %, a content of nitrogen of about 10-20% and a content of hydrogen of about 20-30 at %,
    wherein the light emitting layer is between the substrate and the first inorganic layer,
    the capping layer is between the sealing portion and the light emitting layer,
    at least one of the plurality of sub-inorganic layers comprises SiON:H, and
    at least one of the plurality of sub-inorganic layers comprises SiNx:H.

18. A method of manufacturing a display device, the method comprising:
    forming a light emitting layer on a substrate;
    disposing a structure comprising the substrate and the light emitting layer in a chamber; and
    supplying into the chamber; $SiH_4$ from a first supply pipe, $NH_3$ from a second supply pipe, $N_2O$ from a third supply pipe, $N_2$ from a fourth supply pipe, and $H_2$ from a fifth supply pipe to form an inorganic layer of a sealing portion on the light emitting layer such that the light emitting layer is between the substrate and the first inorganic layer, the inorganic layer comprises silicon, oxygen, nitrogen, and hydrogen, and a content of silicon is about 30-40 (at %), a content of oxygen is about 15-35 at %, a content of nitrogen is about 10-20 at %, a content of hydrogen is about 20-30 at %, wherein a flow rate of the $N_2O$ is about 5 times or more of a flow rate of the $NH_3$.

19. The method of claim 18, wherein the flow rate of the $N_2O$ is in a range from about 1330 standard cubic centimeter per minute (sccm) to about 3990 sccm; and the flow rate of the $NH_3$ is in a range from about 250 sccm to about 750 sccm.

20. The method of claim 18, wherein the flow rate of the $SiH_4$ is in a range from about 495 sccm to about 1485 sccm.

21. The method of claim 18, wherein the flow rate of the $N_2$ is in a range from about 4930 sccm to about 14790 sccm.

22. The method of claim 18, wherein the flow rate of the $H_2$ is in a range from about 5635 sccm to about 16905 sccm.

23. The method of claim 18, further comprising:

mixing the $SiH_4$ from the first supply pipe, the $NH_3$ from the second supply pipe, the $N_2O$ from the third supply pipe, the $N_2$ from the fourth supply pipe, and the $H_2$ from the fifth supply pipe in a mixing unit inside the chamber; and injecting mixed gases from the mixing unit toward the structure by an injecting unit inside the chamber.

24. The method of claim 18, wherein the content of the silicon is about 35 at %, the content of the oxygen is about 25 at %, the content of the nitrogen is about 15 at %, and the content of the hydrogen is about 25 at %.

25. The method of claim 18, wherein the inorganic layer comprises SION:H.

26. The method of claim 18, wherein the inorganic layer has a refractive index substantially equal to or lower than about 1.70.

27. The method of claim 18, further comprising, prior to forming the inorganic layer:

supplying into the chamber; $SiH_4$ from the first supply pipe, $NH_3$ from the second supply pipe, $N_2$ from the fourth supply pipe, and $H_2$ from the fifth supply pipe to form a sub-inorganic layer of the sealing portion on the light emitting layer.

28. The method of claim 18, further comprising:

supplying into the chamber; $SiH_4$ from the first supply pipe, $NH_3$ from the second supply pipe, $N_2$ from the fourth supply pipe, and $H_2$ from the fifth supply pipe to form a second sub-inorganic layer of the sealing portion on the inorganic layer.

29. A display device comprising:

a substrate;

a light emitting layer on the substrate;

a common electrode on the light emitting layer;

a capping layer disposed directly on the common electrode, the capping layer comprising an organic material;

a protective layer disposed directly on the capping layer, the protective layer including LiF, wherein a portion of the protective layer overlapping the light emitting layer has a lower height from the substrate than heights of uppermost surfaces of the common electrode and the capping layer from the substrate; and a sealing portion disposed directly on the protective layer, wherein the sealing portion comprises a first inorganic layer, the first inorganic layer comprises at least one layer including silicon, oxygen, nitrogen and hydrogen, and a difference in a light transmittance of the at least one layer that has been irradiated with sunlight for 1-6 hours in a blue light wavelength region, a green light wavelength region and a red light wavelength region as compared to a light transmittance of the at least one layer that has not been irradiated with sunlight in the blue light wavelength region, the green light wavelength region and the red light wavelength region is less than or equal to about 0.4%.

* * * * *